(12) United States Patent
Satoh et al.

(10) Patent No.: US 8,962,365 B2
(45) Date of Patent: Feb. 24, 2015

(54) METHOD OF MANUFACTURING GAN-BASED FILM AND COMPOSITE SUBSTRATE USED THEREFOR

(75) Inventors: Issei Satoh, Itami (JP); Yuki Seki, Itami (JP); Koji Uematsu, Itami (JP); Yoshiyuki Yamamoto, Itami (JP); Hideki Matsubara, Itami (JP); Shinsuke Fujiwara, Itami (JP); Masashi Yoshimura, Itami (JP)

(73) Assignee: Sumitomo Electric Industies, Ltd., Osaka-shi, Osaka (JP)

( * ) Notice: Subject to any disclaimer, the term of this patent is extended or adjusted under 35 U.S.C. 154(b) by 0 days.

(21) Appl. No.: 13/696,873

(22) PCT Filed: Dec. 21, 2011

(86) PCT No.: PCT/JP2011/079636
§ 371 (c)(1),
(2), (4) Date: Nov. 8, 2012

(87) PCT Pub. No.: WO2013/051163
PCT Pub. Date: Apr. 11, 2013

(65) Prior Publication Data
US 2013/0149847 A1      Jun. 13, 2013

(30) Foreign Application Priority Data

Oct. 7, 2011    (JP) .................................. 2011-222998

(51) Int. Cl.
*H01L 21/00* (2006.01)
*H01L 21/02* (2006.01)
(Continued)

(52) U.S. Cl.
CPC .... *H01L 21/02436* (2013.01); *H01L 21/02422* (2013.01); *H01L 21/02458* (2013.01); *H01L 21/0254* (2013.01); *H01L 21/02658* (2013.01);
(Continued)

(58) Field of Classification Search
USPC ................................ 257/E21.09, 12; 438/47
See application file for complete search history.

(56) References Cited

U.S. PATENT DOCUMENTS

| 5,290,393 A | 3/1994 | Nakamura |
| 2012/0118222 A1* | 5/2012 | Fujiwara et al. ................ 117/58 |

(Continued)

FOREIGN PATENT DOCUMENTS

| JP | 4-297023 | 10/1992 |
| JP | 9-507464 | 7/1997 |

(Continued)

*Primary Examiner* — Bradley K Smith
(74) *Attorney, Agent, or Firm* — Drinker Biddle & Reath LLP

(57) ABSTRACT

The present method of manufacturing a GaN-based film includes the steps of preparing a composite substrate including a support substrate dissoluble in hydrofluoric acid and a single crystal film arranged on a side of a main surface of the support substrate, a coefficient of thermal expansion in the main surface of the support substrate being more than 0.8 time and less than 1.2 times as high as a coefficient of thermal expansion of GaN crystal, forming a GaN-based film on a main surface of the single crystal film arranged on the side of the main surface of the support substrate, and removing the support substrate by dissolving the support substrate in hydrofluoric acid. Thus, the method of manufacturing a GaN-based film capable of efficiently obtaining a GaN-based film having a large main surface area, less warpage, and good crystallinity, as well as a composite substrate used therefor are provided.

6 Claims, 2 Drawing Sheets

(51) Int. Cl.
*C30B 23/02* (2006.01)
*C30B 25/18* (2006.01)
*C30B 29/40* (2006.01)

(52) U.S. Cl.
CPC .... *H01L 21/02664* (2013.01); *H01L 21/02002* (2013.01); *C30B 23/025* (2013.01); *C30B 25/183* (2013.01); *C30B 29/406* (2013.01)
USPC .............................................. 438/47; 257/12

(56) References Cited

U.S. PATENT DOCUMENTS

2012/0122301 A1* 5/2012 Fujiwara et al. .............. 438/478
2013/0040442 A1* 2/2013 Satoh et al. ................... 438/478

FOREIGN PATENT DOCUMENTS

| JP | 2003-165798 | 6/2003 |
| JP | 2007-523472 | 8/2007 |
| JP | 2010-502555 | 1/2010 |
| JP | 2010-182936 | 8/2010 |
| WO | 95/13996 | 5/1995 |
| WO | 2005/076345 | 8/2005 |
| WO | 2006/082467 | 8/2006 |
| WO | 2008/031809 | 3/2008 |

* cited by examiner

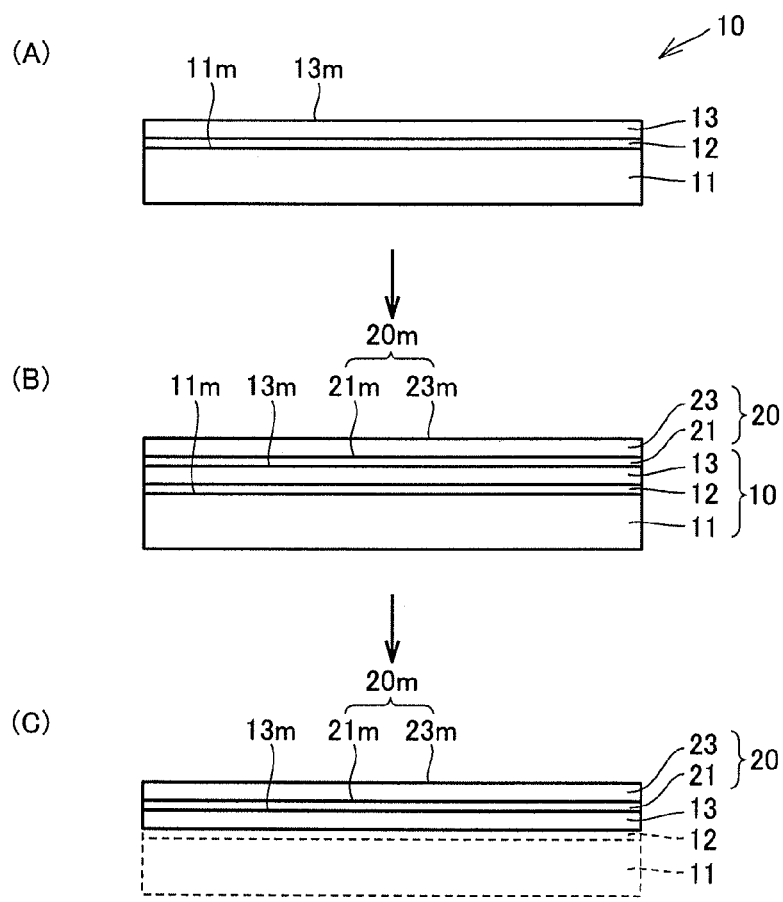

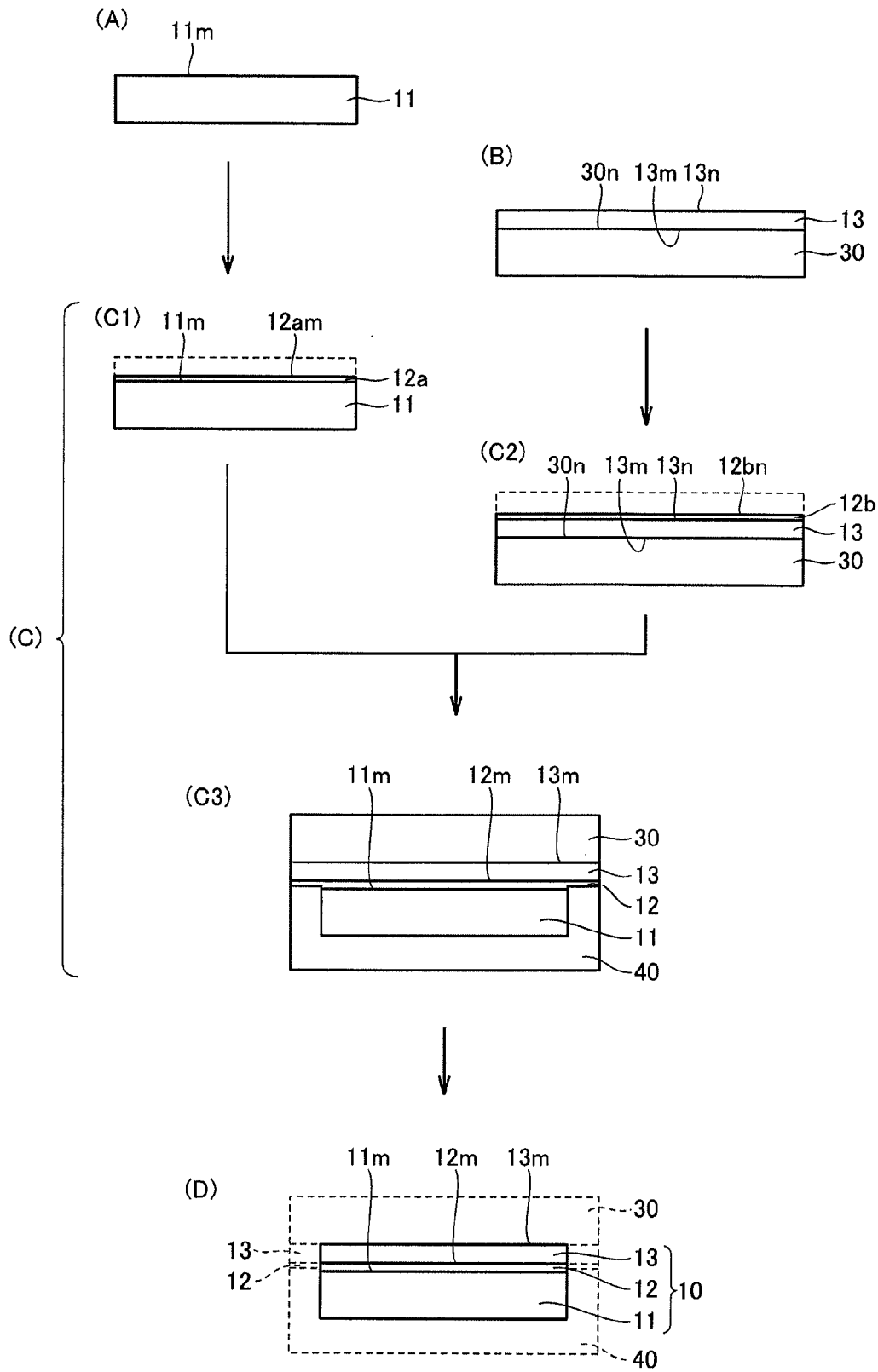

METHOD OF MANUFACTURING GaN-BASED FILM AND COMPOSITE SUBSTRATE USED THEREFOR

TECHNICAL FIELD

The present invention relates to a method of manufacturing a GaN-based film having a large main surface area and less warpage and to a composite substrate used therefor.

BACKGROUND ART

A GaN-based film is suitably used as a substrate and a semiconductor layer in a semiconductor device such as a light emitting device and an electronic device. A GaN substrate is best as a substrate for manufacturing such a GaN-based film, from a point of view of match or substantial match in lattice constant and coefficient of thermal expansion between the substrate and the GaN-based film. A GaN substrate, however, is very expensive, and it is difficult to obtain such a GaN substrate having a large diameter that a diameter of a main surface exceeds 2 inches.

Therefore, a sapphire substrate is generally used as a substrate for forming a GaN-based film. A sapphire substrate and a GaN crystal are significantly different from each other in lattice constant and coefficient of thermal expansion.

Therefore, in order to mitigate unmatch in lattice constant between a sapphire substrate and a GaN crystal and to grow a GaN crystal having good crystallinity, for example, Japanese Patent Laying-Open No. 04-297023 (PTL 1) discloses growing a GaN buffer layer on a sapphire substrate and growing a GaN crystal layer on the GaN buffer layer, in growing GaN crystal on the sapphire substrate.

In addition, in order to obtain a GaN film less in warpage by employing a substrate having a coefficient of thermal expansion close to that of GaN crystal, for example, Japanese National Patent Publication No. 2007-523472 (PTL 2) discloses a composite support substrate having one or more pairs of layers having substantially the same coefficient of thermal expansion with a central layer lying therebetween and having an overall coefficient of thermal expansion substantially the same as a coefficient of thermal expansion of GaN crystal. Moreover, Japanese Patent Laying-Open No. 2003-165798 (PTL 3) discloses a multi-layered substrate containing zircon ceramics or the like.

CITATION LIST

Patent Literature

PTL 1: Japanese Patent Laying-Open No. 04-297023
PTL 2: Japanese National Patent Publication No. 2007-523472
PTL 3: Japanese Patent Laying-Open No. 2003-165798

SUMMARY OF INVENTION

Technical Problem

According to Japanese Patent Laying-Open No. 04-297023 (PTL 1) above, GaN crystal grows as warping in a shape recessed in a direction of growth of crystal, probably because crystal defects such as dislocation disappear as a result of association during growth of the GaN crystal.

As described above, however, the sapphire substrate is much higher in coefficient of thermal expansion than GaN crystal, and hence grown GaN crystal greatly warps in a shape projecting in a direction of growth of crystal during cooling after crystal growth and a GaN film great in warpage in a shape projecting in the direction of growth of crystal is obtained. Here, as the main surface of the sapphire substrate has a greater diameter, warpage of the GaN crystal during cooling above becomes greater (specifically, warpage of the obtained GaN film is substantially in proportion to a square of a diameter of the main surface of the sapphire substrate). Therefore, it becomes difficult to obtain a GaN film less in warpage as the main surface has a greater diameter.

The composite support substrate disclosed in Japanese National Patent Publication No. 2007-523472 (PTL 2) and the multi-layered substrate disclosed in Japanese Patent Laying-Open No. 2003-165798 (PTL 3) above each have a coefficient of thermal expansion substantially the same as that of the GaN crystal and hence warpage of the GaN layer grown thereon can be less. Such a composite support substrate and a multi-layered substrate, however, have a complicated structure, and design and formation of the structure is difficult. Therefore, cost for design and manufacturing becomes very high and cost for manufacturing a GaN film becomes very high.

In addition, as a substrate, a sapphire substrate is employed in Japanese Patent Laying-Open No. 04-297023 (PTL 1), a composite support substrate is employed in Japanese National Patent Publication No. 2007-523472 (PTL 2), and a multi-layered substrate is employed in Japanese Patent Laying-Open No. 2003-165798 (PTL 3). Therefore, it has been difficult to remove the substrate after a GaN film or a GaN layer is formed on the substrate and hence to take the GaN film or the GaN layer.

An object of the present invention is to solve the problems above and to provide a method of manufacturing a GaN-based film capable of taking a GaN-based film having a large main surface area, less warpage, and good crystallinity by using a composite substrate including a support substrate, which has a coefficient of thermal expansion matching or substantially matching with that of a GaN crystal and is readily removed to form a GaN-based film having a large main surface area, less warpage, and good crystallinity, and thereafter removing the support substrate, and a composite substrate used therefor.

Solution to Problem

According to one aspect, the present invention is directed to a composite substrate including a support substrate dissoluble in hydrofluoric acid and a single crystal film arranged on a side of a main surface of the support substrate, and a coefficient of thermal expansion in the main surface of the support substrate is more than 0.8 time and less than 1.2 times as high as a coefficient of thermal expansion of GaN crystal.

In the composite substrate according to the present invention, the support substrate can contain at least any of zirconia and silica and a $ZrO_2$—$SiO_2$ composite oxide formed of zirconia and silica. Alternatively, the support substrate can contain yttria stabilized zirconia and an $Al_2O_3$—$SiO_2$ composite oxide formed of alumina and silica. Here, a content of yttria stabilized zirconia to the total of the $Al_2O_3$—$SiO_2$ composite oxide and yttria stabilized zirconia can be not lower than 20 mass % and not higher than 40 mass %. Further, a content of yttria to yttria stabilized zirconia can be not lower than 5 mol %. Furthermore, an area of a main surface of the single crystal film of the composite substrate according to the present invention can be not smaller than 15 $cm^2$.

According to another aspect, the present invention is directed to a method of manufacturing a GaN-based film including the steps of preparing a composite substrate including a support substrate dissoluble in hydrofluoric acid and a single crystal film arranged on a side of a main surface of the support substrate, a coefficient of thermal expansion in the main surface of the support substrate being more than 0.8 time and less than 1.2 times as high as a coefficient of thermal expansion of GaN crystal, forming a GaN-based film on a main surface of the single crystal film arranged on the side of the main surface of the support substrate, and removing the support substrate by dissolving the support substrate in hydrofluoric acid.

In the method of manufacturing a GaN-based film according to the present invention, the support substrate can contain at least any of zirconia and silica and a $ZrO_2$—$SiO_2$ composite oxide formed of zirconia and silica. Alternatively, the support substrate can contain yttria stabilized zirconia and an $Al_2O_3$—$SiO_2$ composite oxide formed of alumina and silica. Here, a content of yttria stabilized zirconia to the total of the $Al_2O_3$—$SiO_2$ composite oxide and yttria stabilized zirconia can be not lower than 20 mass % and not higher than 40 mass %. Further, a content of yttria to yttria stabilized zirconia can be not lower than 5 mol %. Furthermore, an area of the main surface of the single crystal film of the composite substrate according to the present invention can be not smaller than 15 $cm^2$. The step of forming a GaN-based film can include sub steps of forming a GaN-based buffer layer on the main surface of the single crystal film and forming a GaN-based single crystal layer on a main surface of the GaN-based buffer layer.

Advantageous Effects of Invention

According to the present invention, a method of manufacturing a GaN-based film capable of taking a GaN-based film having a large main surface area, less warpage, and good crystallinity by using a composite substrate including a support substrate, which has a coefficient of thermal expansion matching with or substantially matching with that of a GaN crystal and is readily removed to form a GaN-based film having a large main surface area, less warpage, and good crystallinity, and thereafter removing the support substrate, and a composite substrate used therefor can be provided.

BRIEF DESCRIPTION OF DRAWINGS

FIG. 1 is a schematic cross-sectional view showing one example of a composite substrate according to the present invention.

FIG. 2 is a schematic cross-sectional view showing one example of a method of manufacturing a GaN-based film according to the present invention, (A) showing the step of preparing a composite substrate, (B) showing the step of forming a GaN-based film, and (C) showing the step of removing a support substrate.

FIG. 3 is a schematic cross-sectional view showing one example of the step of preparing a composite substrate according to the present invention.

DESCRIPTION OF EMBODIMENTS

[Composite Substrate]

Referring to FIG. 1, a composite substrate 10 representing one embodiment of the present invention includes a support substrate 11 dissoluble in hydrofluoric acid and a single crystal film 13 arranged on a side of a main surface 11m of support substrate 11, a coefficient of thermal expansion in main surface 11m of support substrate 11 being more than 0.8 time and less than 1.2 times as high as a coefficient of thermal expansion of GaN crystal.

Since composite substrate 10 in the present embodiment has a coefficient of thermal expansion in main surface 11m of support substrate 11 more than 0.8 time and less than 1.2 times as high as a coefficient of thermal expansion of GaN crystal, a GaN-based film low in dislocation density and excellent in crystallinity can be formed on a main surface 13m of single crystal film 13 formed on main surface 11m of support substrate 11, in spite of a large area of main surface 13m. In addition, since support substrate 11 is dissoluble in hydrofluoric acid, by removing support substrate 11 with hydrofluoric acid after a GaN-based film is formed on main surface 13m of single crystal film 13 of composite substrate 10, a GaN-based film low in dislocation density and excellent in crystallinity that is formed on main surface 13m of single crystal film 13 can efficiently be obtained.

(Support Substrate)

With regard to support substrate 11 of composite substrate 10 in the present embodiment, from a point of view of formation of a GaN-based film having a large main surface area, low dislocation density, and good crystallinity on main surface 13m of single crystal film 13m formed on main surface 11m of support substrate 11, a coefficient of thermal expansion in main surface 11m of support substrate 11 should be more than 0.8 time and less than 1.2 times, preferably more than 0.9 time and less than 1.15 times, and further preferably more than 0.95 time and less than 1.1 times as high as a coefficient of thermal expansion of GaN crystal. In addition, from a point of view of efficient removal of the support substrate from the formed GaN-based film, support substrate 11 should be dissoluble in hydrofluoric acid.

Here, since GaN crystal has wurtzite-type hexagonal crystal structure, it has a coefficient of thermal expansion in a direction of an a axis and a coefficient of thermal expansion in a direction of a c axis different from each other. In order to lessen warpage of the composite substrate and the GaN-based film formed on the main surface thereof, the coefficient of thermal expansion in the main surface of the support substrate should be the same as or close to the coefficient of thermal expansion in the main surface of the formed GaN-based film. Therefore, the coefficient of thermal expansion of GaN crystal to be compared with the coefficient of thermal expansion of the support substrate is a coefficient of thermal expansion of the GaN crystal in the direction of the a axis in a case where the main surface of the formed GaN-based film is perpendicular to the c axis, and it is a coefficient of thermal expansion of the GaN crystal in the direction of the c axis in a case where the main surface of the formed GaN-based film is perpendicular to the a axis. Since the main surface of the single crystal film of the composite substrate is normally perpendicular to the direction of the c axis, the main surface of the formed GaN-based film is perpendicular to the direction of the c axis and hence the coefficient of thermal expansion in the main surface of the support substrate is compared with the coefficient of thermal expansion of the GaN crystal in the direction of the a axis.

Support substrate 11 is not particularly restricted so long as a coefficient of thermal expansion in main surface 11m of support substrate 11 is more than 0.8 time and less than 1.2 times as high as a coefficient of thermal expansion of GaN crystal and the support substrate is dissoluble in hydrofluoric acid, and it may be monocrystalline, polycrystalline, or non-crystalline. From a point of view of ease in adjustment of a coefficient of thermal expansion and solution in hydrofluoric acid, support substrate 11 preferably contains at least any of a metal oxide and a silicon oxide.

Further, from a point of view of ease in adjustment of a coefficient of thermal expansion and ease in obtaining a coefficient of thermal expansion within the range above by varying a type and a ratio of source materials therefor, support substrate 11 is more preferably made of a sintered body containing at least any of a metal oxide and a silicon oxide. For example, an $Al_2O_3$—$SiO_2$-based sintered body, an MgO—$SiO_2$-based sintered body, a $ZrO_2$—$SiO_2$-based sintered body, a $Y_2O_3$—$ZrO_2$—MgO—$SiO_2$-based sintered body, or the like is further preferred.

Here, support substrate 11 particularly preferably contains at least any of zirconia and silica and a $ZrO_2$—$SiO_2$ composite oxide formed of zirconia ($ZrO_2$) and silica ($SiO_2$). Here, the $ZrO_2$—$SiO_2$ composite oxide refers to a composite oxide such as zircon ($ZrSiO_4$) formed of $ZrO_2$ and $SiO_2$. Such a $ZrO_2$—$SiO_2$ composite oxide is not dissolved or less likely to be dissolved in hydrofluoric acid. Therefore, from a point of view of solution in hydrofluoric acid, support substrate 11 contains at least any of zirconia ($ZrO_2$) and silica ($SiO_2$), in addition to the $ZrO_2$—$SiO_2$ composite oxide. Presence of $ZrO_2$, $SiO_2$ and a composite oxide such as $ZrSiO_4$ as well as a composition ratio thereof can be determined through X-ray diffraction.

Support substrate 11 containing at least any of zirconia ($ZrO_2$) and silica ($SiO_2$) and a $ZrO_2$—$SiO_2$ composite oxide (for example, $ZrSiO_4$) as above is obtained by causing complete or incomplete reaction between $ZrO_2$ and $SiO_2$ at a molar ratio other than 1:1 or by causing incomplete reaction between $ZrO_2$ and $SiO_2$ at a molar ratio of 1:1.

Alternatively, support substrate 11 particularly preferably contains yttria stabilized zirconia ($Y_2O_3$ stabilized ZrO, hereinafter also referred to as YSZ) and an $Al_2O_3$—$SiO_2$ composite oxide formed of alumina ($Al_2O_3$) and silica ($SiO_2$). Support substrate 11 containing the $Al_2O_3$—$SiO_2$ composite oxide and YSZ (yttria stabilized zirconia) is dissoluble in hydrofluoric acid and it allows growth of a GaN-based film excellent in crystallinity on single crystal film 13 arranged on the main surface side of support substrate 11 of composite substrate 10. Here, the $Al_2O_3$—$SiO_2$ composite oxide is not particularly restricted, and mullite ($3Al_2O_3.2SiO_2$ to $2Al_2O_3.SiO_2$ or $Al_6O_{13}Si_2$) or the like is suitable.

From a point of view of suppression of cracks generated in a GaN-based film during growth of a GaN-based film excellent in crystallinity on single crystal film 13 on support substrate 11 containing an $Al_2O_3$—$SiO_2$ composite oxide and YSZ (yttria stabilized zirconia), a content of YSZ to the total of the $Al_2O_3$—$SiO_2$ composite oxide and YSZ is preferably not lower than 20 mass % and not higher than 40 mass % and more preferably not lower than 25 mass % and not higher than 35 mass %. Further, from a point of view the same as above, a content of yttria ($Y_2O_3$) to YSZ is preferably not lower than 5 mol % and more preferably not lower than 6 mol % and not higher than 50 mol %.

Here, since coefficients of thermal expansion of support substrate 11 and GaN crystal generally greatly fluctuate depending on temperatures thereof, it is important to make determination depending on a coefficient of thermal expansion at any temperature or in any temperature region. An object of the present invention is to manufacture a GaN-based film less in warpage on a composite substrate, and it is considered as proper to handle an average coefficient of thermal expansion of each of a support substrate and GaN crystal from a room temperature to a film formation temperature for a GaN-based film as a coefficient of thermal expansion of each of the support substrate and the GaN crystal, because a GaN-based film is formed on a composite substrate at a film formation temperature for a GaN-based film increased from a room temperature, thereafter a temperature is lowered to the room temperature, and then the GaN-based film formed on the composite substrate is taken. Even in an inert gas atmosphere, however, GaN crystal is decomposed when a temperature exceeds 800° C. Therefore, in the present invention, it is assumed that coefficients of thermal expansion of the support substrate and the GaN crystal are determined by an average coefficient of thermal expansion from a room temperature (specifically 25° C.) to 800° C.

(Single Crystal Film)

From a point of view of growth of a GaN-based film having less warpage, low dislocation density, and good crystallinity, single crystal film 13 arranged on the main surface 11m side of support substrate 11 of composite substrate 10 in the present embodiment preferably has hexagonal crystal structure similarly to GaN crystal, and a sapphire film having a (0001) plane as main surface 13m, an SiC film having a (0001) plane as main surface 13m, a GaN film having a (0001) plane as main surface 13m, and the like are preferred. In a case where a GaN-based film having a main surface perpendicular to the c axis is to be formed, the single crystal film preferably has three-fold symmetry with respect to an axis perpendicular to the main surface thereof, and an Si film having a (111) plane as main surface 13m and a GaAs film having a (111) plane as main surface 13m in addition to the sapphire film, the SiC film, and the GaN-based film above are also suitable.

Further, though an area of main surface 13m of single crystal film 13 in composite substrate 10 is not particularly restricted, from a point of view of growth of a GaN-based film having a large main surface area, the area is preferably not smaller than 15 cm².

(Adhesive Layer)

From a point of view of improved joint strength between support substrate 11 and single crystal film 13, composite substrate 10 in the present embodiment preferably has an adhesive layer 12 formed between support substrate 11 and single crystal film 13. Though adhesive layer 12 is not particularly restricted, from a point of view of a high effect of improvement in joint strength between support substrate 11 and single crystal film 13, an $SiO_2$ layer, a $TiO_2$ layer, or the like is preferred. Further, from a point of view of removal with hydrofluoric acid, the $SiO_2$ layer is further preferred.

(Method of Manufacturing Composite Substrate)

A method of manufacturing a composite substrate is the same as the step of preparing a composite substrate in a method of manufacturing a GaN-based film which will be described later.

[Method of Manufacturing GaN-Based Film]

Referring to FIG. 2, a method of manufacturing a GaN-based film according to another embodiment of the present invention includes the steps of preparing composite substrate 10 including support substrate 11 dissoluble in hydrofluoric acid and single crystal film 13 arranged on the main surface 11m side of support substrate 11, a coefficient of thermal expansion in main surface 11m of support substrate 11 being more than 0.8 time and less than 1.2 times as high as a coefficient of thermal expansion of GaN crystal (FIG. 2(A)), forming a GaN-based film 20 on main surface 13m of single crystal film 13 arranged on the main surface 11m side of support substrate 11 (FIG. 2(B)), and removing support substrate 11 by dissolving the same in hydrofluoric acid (FIG. 2(C)). Here, GaN-based film 20 refers to a film formed of a group III nitride containing Ga as a group III element and it is exemplified, for example, by a $Ga_xIn_yAl_{1-x-y}N$ film (x>0, y≥0, x+y≤1).

According to the method of manufacturing a GaN-based film in the present embodiment, by employing composite substrate 10 including support substrate 11 dissoluble in hydrofluoric acid and single crystal film 13 arranged on the main surface 11m side of support substrate 11, a coefficient of thermal expansion in main surface 11m of support substrate 11 being more than 0.8 time and less than 1.2 times as high as a coefficient of thermal expansion of GaN crystal, forming GaN-based film 20 on main surface 13m of single crystal film 13 of composite substrate 10, and thereafter removing support substrate 11 of composite substrate 10 by dissolving the same in hydrofluoric acid, GaN-based film 20 having a large main surface area, less warpage, and good crystallinity can efficiently be obtained.

(Step of Preparing Composite Substrate)

Referring to FIG. 2(A), the method of manufacturing a GaN-based film in the present embodiment initially includes the step of preparing composite substrate 10 including support substrate 11 dissoluble in hydrofluoric acid and single crystal film 13 arranged on the main surface 11m side of support substrate 11, a coefficient of thermal expansion in main surface 11m of support substrate 11 being more than 0.8 time and less than 1.2 times as high as a coefficient of thermal expansion of GaN crystal.

Since composite substrate 10 above includes support substrate 11 and single crystal film 13, a coefficient of thermal expansion in main surface 11m of support substrate 11 being more than 0.8 time and less than 1.2 times as high as a coefficient of thermal expansion of GaN crystal, a GaN-based film having a large main surface area, less warpage, and good crystallinity can be formed on main surface 13m of single crystal film 13. In addition, in composite substrate 10 above, since support substrate 11 is dissoluble in hydrofluoric acid, a GaN-based film having a large main surface area, less warpage, and good crystallinity can efficiently be taken by removing support substrate 11.

In addition, a method of arranging single crystal film 13 on the main surface 11m side of support substrate 11 of composite substrate 10 is not particularly restricted, and exemplary methods include a method of growing single crystal film 13 on main surface 11m of support substrate 11 (a first method), a method of bonding single crystal film 13 formed on a main surface of an underlying substrate to main surface 11m of support substrate 11 and thereafter removing the underlying substrate (a second method), a method of bonding single crystal (not shown) to main surface 11m of support substrate 11 and thereafter separating the single crystal at a plane at a prescribed depth from a bonding surface to thereby form single crystal film 13 on main surface 11m of support substrate 11 (a third method), and the like. In a case where a support substrate is made of a polycrystalline sintered body, the first method above is difficult and hence any of the second and third methods above is preferably employed. A method of bonding single crystal film 13 to support substrate 11 in the second method above is not particularly restricted, and exemplary methods include a method of directly bonding single crystal film 13 to main surface 11m of support substrate 11, a method of bonding single crystal film 13 to main surface 11m of support substrate 11 with adhesive layer 12 being interposed, and the like. A method of bonding single crystal to support substrate 11 in the third method above is not particularly restricted, and exemplary methods include a method of directly bonding single crystal to main surface 11m of support substrate 11, a method of bonding single crystal to main surface 11m of support substrate 11 with adhesive layer 12 being interposed, and the like.

The step of preparing composite substrate 10 above is not particularly restricted. From a point of view of efficient preparation of composite substrate 10 of high quality, however, for example, referring to FIG. 3, the second method above can include sub steps of preparing support substrate 11 (FIG. 3(A)), forming single crystal film 13 on a main surface 30n of an underlying substrate 30 (FIG. 3(B)), bonding support substrate 11 and single crystal film 13 to each other (FIG. 3(C)), and removing underlying substrate 30 (FIG. 3(D)).

In FIG. 3(C), in the sub step of bonding support substrate 11 and single crystal film 13 to each other, an adhesive layer 12a is formed on main surface 11m of support substrate 11 (FIG. 3(C1)), an adhesive layer 12b is formed on a main surface 13n of single crystal film 13 grown on main surface 30n of underlying substrate 30 (FIG. 3(C2)), thereafter a main surface 12am of adhesive layer 12a formed on support substrate 11 and a main surface 12bn of adhesive layer 12b formed on single crystal film 13 formed on underlying substrate 30 are bonded to each other, and thus support substrate 11 and single crystal film 13 are bonded to each other with adhesive layer 12 formed by joint between adhesive layer 12a and adhesive layer 12b being interposed (FIG. 3(C3)). If support substrate 11 and single crystal film 13 can be joined to each other, however, support substrate 11 and single crystal film 13 can directly be bonded to each other without adhesive layer 12 being interposed.

A specific technique for bonding support substrate 11 and single crystal film 13 to each other is not particularly restricted. From a point of view of ability to hold joint strength even at a high temperature after bonding, however, a direct joint method of washing a bonding surface, performing bonding, and thereafter increasing a temperature to about 600° C. to 1200° C. for joint, a surface activation method of washing a bonding surface, activating the bonding surface with plasma, ions or the like, and thereafter performing joint at a low temperature from around a room temperature (for example, 25° C.) to 400° C., and the like are preferably employed.

Since a material and a physical property of support substrate 11, single crystal film 13, and adhesive layer 12 in composite substrate 10 thus obtained are as described above, description will not be repeated.

(Step of Forming GaN-Based Film)

Referring to FIG. 2(B), the method of manufacturing a GaN-based film in the present embodiment then includes the step of forming GaN-based film 20 on main surface 13m of single crystal film 13 in composite substrate 10.

Composite substrate 10 prepared in the step of preparing a composite substrate above includes support substrate 11 in which a coefficient of thermal expansion in main surface 11m of support substrate 11 is more than 0.8 time and less than 1.2 times as high as a coefficient of thermal expansion of GaN crystal, and single crystal film 13. Therefore, GaN-based film 20 having a large area of a main surface 20m, less warpage, and good crystallinity can be formed on main surface 13m of single crystal film 13.

Though a method of forming GaN-based film 20 is not particularly restricted, from a point of view of forming a GaN-based film low in dislocation density, a vapor phase epitaxy method such as an MOCVD (Metal Organic Chemical Vapor Deposition) method, an HVPE (Hydride Vapor Phase Epitaxy) method, an MBE (Molecular Beam Epitaxy) method, and a sublimation method, a liquid phase epitaxy method such as a flux method and a high nitrogen pressure solution method, and the like are preferably exemplified.

The step of forming GaN-based film 20 is not particularly restricted. From a point of view of forming a GaN-based film low in dislocation density, however, the step preferably includes sub steps of forming a GaN-based buffer layer 21 on main surface 13m of single crystal film 13 of composite substrate 10 and forming a GaN-based single crystal layer 23 on a main surface 21m of GaN-based buffer layer 21. Here, GaN-based buffer layer 21 refers to a layer low in crystallinity or non-crystalline, that is a part of GaN-based film 20 and grown at a temperature lower than a growth temperature of GaN-based single crystal layer 23 which is another part of GaN-based film 20.

By forming GaN-based buffer layer 21, unmatch in lattice constant between single crystal film 13 and GaN-based single crystal layer 23 formed on GaN-based buffer layer 21 is mitigated, and hence crystallinity of GaN-based single crystal layer 23 improves and dislocation density thereof is lowered. Consequently, crystallinity of GaN-based film 20 improves and dislocation density thereof is lowered.

GaN-based single crystal layer 23 can also be grown as GaN-based film 20 on single crystal film 13, without growing GaN-based buffer layer 21. Such a method is suitable for a case where unmatch in lattice constant between single crystal film 13 and GaN-based film 20 formed thereon is less.

(Step of Removing Support Substrate)

Referring to FIG. 2(C), the method of manufacturing a GaN-based film in the present embodiment then includes the step of removing support substrate 11 by dissolving the same in hydrofluoric acid.

In composite substrate 10 prepared in the step of preparing a composite substrate above, since support substrate 11 is dissoluble in hydrofluoric acid, by removing support substrate 11 by dissolving the same in hydrofluoric acid, GaN-based film 20 having a large area of main surface 20m, less warpage, and good crystallinity formed on main surface 13m of single crystal film 13 is obtained. Here, in a case where single crystal film 13 is formed from a GaN-based single crystal film such as a GaN single crystal film, a GaN-based film formed of a GaN-based material in its entirety is obtained.

EXAMPLES

Example 1

1. Measurement of Coefficient of Thermal Expansion of GaN Crystal

A sample for evaluation having a size of 2×2×20 mm (having the a axis in a longitudinal direction and having any of a c plane and an m plane as a plane in parallel to the longitudinal direction, with accuracy in plane orientation being within ±0.1°) was cut from GaN single crystal grown with the HVPE method and having dislocation density of $1 \times 10^6$ $cm^{-2}$, Si concentration of $1 \times 10^{18}$ $cm^{-2}$, oxygen concentration of $1 \times 10^{17}$ $cm^{-2}$, and carbon concentration of $1 \times 10^{16}$ $cm^{-2}$.

An average coefficient of thermal expansion of the sample for evaluation above when a temperature was increased from a room temperature (25° C.) to 800° C. was measured with TMA (thermomechanical analysis). Specifically, using TMA8310 manufactured by Rigaku Corporation, the coefficient of thermal expansion of the sample for evaluation was measured with differential dilatometry in an atmosphere in which a nitrogen gas flows. An average coefficient of thermal expansion $\alpha_{GaN}$ from 25° C. to 800° C. of GaN crystal in the direction of the a axis obtained by such measurement was $5.84 \times 10^{-6}$/° C.

2. Step of Preparing Composite Substrate (1) Sub Step of Preparing Support Substrate Referring to FIG. 3(A), 13 types of $ZrO_2$—$SiO_2$-based sintered bodies A to M were prepared by sintering a mixture of $ZrO_2$ and $SiO_2$ at a prescribed molar ratio as a material for support substrate 11 at a pressure of 50 MPa in a direction of one axis in an argon gas atmosphere at 1700° C. for 1 hour. As a result of confirmation with X-ray diffraction, in each of these 13 types of $ZrO_2$—$SiO_2$-based sintered bodies A to M, $ZrSiO_4$, $ZrO_2$, and $SiO_2$ were present. In addition, a sample for measurement having a size of 2×2×20 mm (having a direction substantially parallel to the main surface of the support substrate cut from a sintered body as the longitudinal direction) was cut from each of the 13 types of $ZrO_2$—$SiO_2$-based sintered bodies above. Here, since the $ZrO_2$—$SiO_2$-based sintered body does not have directional specificity, any cutting direction was set. An average coefficient of thermal expansion $\alpha_S$ of each of these samples for measurement when a temperature was increased from a room temperature (25° C.) to 800° C. was measured as described above.

$ZrO_2$—$SiO_2$-based sintered body A had a molar ratio between $ZrO_2$ and $SiO_2$ of 82:18, and attained average coefficient of thermal expansion $\alpha_S$ from 25° C. to 800° C. (hereinafter simply referred to as average coefficient of thermal expansion $\alpha_S$) of $4.25 \times 10^{-6}$/° C. and a ratio of average coefficient of thermal expansion $\alpha_S$ of the sintered body to average coefficient of thermal expansion $\alpha_{GaN}$ of the GaN crystal in the direction of the a axis (hereinafter denoted as an $\alpha_S/\alpha_{GaN}$ ratio) was 0.728. $ZrO_2$—$SiO_2$-based sintered body B had a molar ratio between $ZrO_2$ and $SiO_2$ of 77:23, and attained average coefficient of thermal expansion $\alpha_S$ of $4.75 \times 10^{-6}$/° C. and the $\alpha_S/\alpha_{GaN}$ ratio of 0.813. $ZrO_2$—$SiO_2$-based sintered body C had a molar ratio between $ZrO_2$ and $SiO_2$ of 71:29, and attained average coefficient of thermal expansion $\alpha_S$ of $5.00 \times 10^{-6}$/° C. and the $\alpha_S/\alpha_{GaN}$ ratio of 0.856. $ZrO_2$—$SiO_2$-based sintered body D had a molar ratio between $ZrO_2$ and $SiO_2$ of 69:31, and attained average coefficient of thermal expansion $\alpha_S$ of $5.20 \times 10^{-6}$/° C. and the $\alpha_S/\alpha_{GaN}$ ratio of 0.890. $ZrO_2$—$SiO_2$-based sintered body E had a molar ratio between $ZrO_2$ and $SiO_2$ of 66:34, and attained average coefficient of thermal expansion $\alpha_S$ of $5.40 \times 10^{-6}$/° C. and the $\alpha_S/\alpha_{GaN}$ ratio of 0.925. $ZrO_2$—$SiO_2$-based sintered body F had a molar ratio between $ZrO_2$ and $SiO_2$ of 63:37, and attained average coefficient of thermal expansion $\alpha_S$ of $5.60 \times 10^{-6}$/° C. and the $\alpha_S/\alpha_{GaN}$ ratio of 0.959. $ZrO_2$—$SiO_2$-based sintered body G had a molar ratio between $ZrO_2$ and $SiO_2$ of 58:42, and attained average coefficient of thermal expansion $\alpha_S$ of $5.80 \times 10^{-6}$/° C. and the $\alpha_S/\alpha_{GaN}$ ratio of 0.993. $ZrO_2$—$SiO_2$-based sintered body H had a molar ratio between $ZrO_2$ and $SiO_2$ of 57:43, and attained average coefficient of thermal expansion $\alpha_S$ of $6.00 \times 10^{-6}$/° C. and the $\alpha_S/\alpha_{GaN}$ ratio of 1.027. $ZrO_2$—$SiO_2$-based sintered body I had a molar ratio between $ZrO_2$ and $SiO_2$ of 53:47, and attained average coefficient of thermal expansion $\alpha_S$ of $6.33 \times 10^{-6}$/° C. and the $\alpha_S/\alpha_{GaN}$ ratio of 1.084. $ZrO_2$—$SiO_2$-based sintered body J had a molar ratio between $ZrO_2$ and $SiO_2$ of 46:54, and attained average coefficient of thermal expansion $\alpha_S$ of $6.67 \times 10^{-6}$/° C. and the $\alpha_S/\alpha_{GaN}$ ratio of 1.142. $ZrO_2$—$SiO_2$-based sintered body K had a molar ratio between $ZrO_2$ and $SiO_2$ of 42:58, and attained average coefficient of thermal expansion $\alpha_S$ of $7.00 \times 10^{-6}$/° C. and the $\alpha_S/\alpha_{GaN}$ ratio of 1.199. $ZrO_2$—$SiO_2$-based sintered body L had a molar ratio between $ZrO_2$ and $SiO_2$ of 38:62, and attained average coefficient of thermal expansion $\alpha_S$ of $7.25 \times 10^{-6}$/° C. and the $\alpha_S/\alpha_{GaN}$ ratio of 1.241. $ZrO_2$—$SiO_2$-based sintered body M had a molar ratio between $ZrO_2$ and $SiO_2$ of 35:65, and attained average coefficient of thermal expansion $\alpha_S$ of $7.50\times10^{-6}/°$ C. and the $\alpha_S/\alpha_{GaN}$ ratio of 1.284.

A support substrate having a diameter of 4 inches (101.6 mm) and a thickness of 1 mm was cut from each of 13 types of $ZrO_2$—$SiO_2$-based sintered bodies A to M above, and opposing main surfaces of each support substrate were mirror-polished to thereby obtain 13 types of support substrates A to M. Namely, an average coefficient of thermal expansion of each of 13 types of support substrates A to M from 25° C. to 800° C. was equal to an average coefficient of thermal expansion of each corresponding one of 13 types of $ZrO_2$—$SiO_2$-based sintered bodies A to M from 25° C. to 800° C. Table 1 summarizes the results.

(2) Sub Step of Forming Single Crystal Film on Underlying Substrate

Referring to FIG. 3(B), an Si substrate having a mirror-polished (111) plane as main surface 30n and having a diameter of 5 inches (127 mm) and a thickness of 0.5 mm was prepared as underlying substrate 30.

A GaN film having a thickness of 0.4 μm was formed as single crystal film 13 on main surface 30n of the Si substrate (underlying substrate 30) above with an MOCVD method. Regarding film formation conditions, a TMG gas and an $NH_3$ gas were used as source gases, an $H_2$ gas was used as a carrier gas, a film formation temperature was set to 1000° C., and a film formation pressure was set to 1 atmosphere. Main surface 13m of the GaN film (single crystal film 13) thus obtained had a plane orientation having an off angle within ±1° with respect to the (0001) plane.

(3) Sub Step of Bonding Support Substrate and Single Crystal Film to Each Other

Referring to (C1) in FIG. 3(C), an $SiO_2$ film having a thickness of 2 μm was formed on main surface 11m of each of support substrates A to M (support substrate 11) in FIG. 3(A) with a CVD (chemical vapor deposition) method. Then, by polishing the $SiO_2$ film having a thickness of 2 μm on main surface 11m of each of support substrates A to M (support substrate 11) with $CeO_2$ slurry, only an $SiO_2$ layer having a thickness of 0.2 μm was allowed to remain to serve as adhesive layer 12a. Thus, pores in main surface 11m of each of support substrates A to M (support substrate 11) were buried to thereby obtain the $SiO_2$ layer (adhesive layer 12a) having flat main surface 12am and a thickness of 0.2 μm.

Referring also to (C2) in FIG. 3(C), an $SiO_2$ film having a thickness of 2 μm was formed on main surface 13n of the GaN film (single crystal film 13) formed on the Si substrate (underlying substrate 30) in FIG. 3(B) with the CVD method. Then, by polishing this $SiO_2$ film having a thickness of 2 μm with $CeO_2$ slurry, only an $SiO_2$ layer having a thickness of 0.2 μm was allowed to remain to serve as adhesive layer 12b.

Referring next to (C3) in FIG. 3(C), main surface 12 of the $SiO_2$ layer (adhesive layer 12a) formed on each of support substrates A to M (support substrate 11) and main surface 12bn of the $SiO_2$ layer (adhesive layer 12b) formed on the GaN film (single crystal film 13) formed on the Si substrate (underlying substrate 30) were cleaned and activated by argon plasma, and thereafter main surface 12am of the $SiO_2$ layer (adhesive layer 12a) and main surface 12bn of the $SiO_2$ layer (adhesive layer 12b) were bonded to each other, followed by heat treatment for 2 hours in a nitrogen atmosphere at 300° C.

(4) Sub Step of Removing Underlying Substrate

Referring to FIG. 3(D), a main surface on a back side (a side where single crystal film 13 was not bonded) and a side surface of each of support substrates A to M (support substrate 11) were covered and protected with wax 40, and thereafter the Si substrate (underlying substrate 30) was removed by etching using a mixed acid aqueous solution of 10 mass % of hydrofluoric acid and 5 mass % of nitric acid. Thus, composite substrates A to M (composite substrate 10) in which GaN films (single crystal films 13) were arranged on the main surface 11m sides of support substrates A to M (support substrates 11) respectively were obtained.

3. Step of Forming GaN-Based Film

Referring to FIG. 2(B), a GaN film (GaN-based film 20) was formed with the MOCVD method on main surface 13m (such a main surface being a (0001) plane) of the GaN film (single crystal film 13) of each of composite substrates A to M (composite substrate 10) having a diameter of 4 inches (101.6 mm) obtained above and on a main surface of a sapphire substrate having a diameter of 4 inches (101.6 mm) and a thickness of 1 mm (such a main surface being a (0001) plane). In forming the GaN film (GaN-based film 20), a TMG (trimethylgallium) gas and an $NH_3$ gas were used as source gases, an $H_2$ gas was used as a carrier gas, and a GaN buffer layer (GaN-based buffer layer 21) was grown to a thickness of 0.1 μm at 500° C. and then a GaN single crystal layer (GaN-based single crystal layer 23) was grown to a thickness of 5 μm at 1050° C. Here, a rate of growth of the GaN single crystal layer was 1 μm/hr. Thereafter, wafers A to M and R in which GaN films were formed on composite substrates A to M and the sapphire substrate respectively were cooled to a room temperature (25° C.) at a rate of 10° C./min.

Regarding wafers A to M and R taken out of a film formation apparatus after cooling to a room temperature, warpage of the wafer and crack count and dislocation density of the GaN film were determined. Here, a shape of warpage and an amount of warpage of the wafer were determined based on interference fringes observed at the main surface of the GaN film with FM200EWafer of Corning Tropel. Regarding crack count in the GaN film, the number of cracks per unit length was counted with a Nomarski microscope, and evaluation as "extremely few", "few", "many", and "extremely many" was made when the count was smaller than 1 count/mm, when the count was not smaller than 1 count/mm and smaller than 5 counts/mm, when the count was not smaller than 5 counts/mm and smaller than 10 counts/mm, and when the count was not smaller than 10 counts/mm, respectively. Dislocation density of the GaN film was measured with CL (cathode luminescence) based on the number of dark points per unit area. It is noted that cracks generated in the GaN film in the present Example were small without penetrating the film.

Wafer A warped on the GaN film side in a recessed manner, an amount of warpage was 680 μm and cracks counted in the GaN film were extremely many. Wafer B warped on the GaN film side in a recessed manner, an amount of warpage was 630 μm cracks counted in the GaN film were few, and dislocation density of the GaN film was $4\times10^8$ $cm^{-2}$. Wafer C warped on the GaN film side in a recessed manner, an amount of warpage was 500 μm, cracks counted in the GaN film were few, and dislocation density of the GaN film was $3\times10^8$ $cm^{-2}$. Wafer D warped on the GaN film side in a recessed manner, an amount of warpage was 400 μm, cracks counted in the GaN film were few, and dislocation density of the GaN film was $2.5\times10^8$ $cm^{-2}$. Wafer E warped on the GaN film side in a recessed manner, an amount of warpage was 350 μm, cracks counted in the GaN film were few, and dislocation density of the GaN film was $2\times10^8$ $cm^{-2}$. Wafer F warped on the GaN film side in a recessed manner, an amount of warpage was 230 μm, cracks counted in the GaN film were extremely few, and dislocation density of the GaN film was $1\times10^8$ $cm^{-2}$. Wafer G warped on the GaN film side in a recessed manner, an amount of warpage was 150 μm, cracks counted in the GaN film were extremely few, and dislocation density of the GaN film was $1\times10^8$ cm$^{-2}$. Wafer H warped on the GaN film side in a recessed manner, an amount of warpage was 10 μm, cracks counted in the GaN film were extremely few, and dislocation density of the GaN film was $1\times10^8$ cm$^{-2}$. Wafer I warped on the GaN film side in a projecting manner, an amount of warpage was 15 μm, cracks counted in the GaN film were extremely few, and dislocation density of the GaN film was $1\times10^8$ cm$^{-2}$. Wafer J warped on the GaN film side in a projecting manner, an amount of warpage was 120 μm, cracks counted in the GaN film were few, and dislocation density of the GaN film was $2\times10^8$ cm$^{-2}$. Wafer K warped on the GaN film side in a projecting manner, an amount of warpage was 230 μm, cracks counted in the GaN film were few, and dislocation density of the GaN film was $3\times10^8$ cm$^{-2}$. Wafer L warped on the GaN film side in a projecting manner, an amount of warpage was 745 μm, cracks counted in the GaN film were few, and dislocation density of the GaN film was $4\times10^8$ cm$^{-2}$. In wafer M, cracking occurred in the support substrate and a sufficient GaN film was not obtained. Wafer R warped on the GaN film side in a projecting manner, an amount of warpage was 750 μm, cracks counted in the GaN film were few, and dislocation density of the GaN film was $4\times10^8$ cm$^{-2}$. Table 1 summarizes these results. In Table 1, "-" indicates that that physical property value was not measured.

4. Step of Removing Support Substrate

Referring to FIG. 2(C), wafers A to L obtained above were immersed in an aqueous solution of 10 mass % of hydrofluoric acid and support substrates A to L (support substrate 11) and the SiO$_2$ layers were dissolved and removed. Thus, GaN films A to L (GaN-based film 20) formed on respective main surfaces 13m of the GaN films (single crystal film 13) were obtained. In GaN films A to L (GaN-based film 20) obtained by removing support substrates A to L and the SiO$_2$ layers from wafers A to L as well, warpage was found in measurement based on interference fringes observed with FM200EWafer of Corning Tropel, and an extent of warpage in GaN films A to L maintained an extent of warpage in wafers A to L.

TABLE 1

|  |  | Wafer A | Wafer B | Wafer C | Wafer D | Wafer E | Wafer F | Wafer G |
|---|---|---|---|---|---|---|---|---|
| Composite Substrate | Coefficient of Thermal Expansion $\alpha_S$ ($10^{-6}$/° C.) | 4.25 | 4.75 | 5.00 | 5.20 | 5.40 | 5.60 | 5.80 |
|  | $\alpha_S/\alpha_{GaN}$ Ratio | 0.728 | 0.813 | 0.856 | 0.890 | 0.925 | 0.959 | 0.993 |
| Wafer | Shape of Warpage [GaN Film Side] | Recess | Recess | Recess | Recess | Recess | Recess | Recess |
|  | Amount of Warpage [GaN Film] (μm) | 680 | 630 | 500 | 400 | 350 | 230 | 150 |
|  | Cracks Counted in GaN Film | Extremely many | Few | Few | Few | Few | Extremely few | Extremely few |
|  | Dislocation Density of GaN Film ($10^8$ cm$^{-2}$) | — | 4 | 3 | 2.5 | 2 | 1 | 1 |
|  | Notes |  |  |  |  |  |  |  |

|  |  | Wafer H | Wafer I | Wafer J | Wafer K | Wafer L | Wafer M | Wafer R |
|---|---|---|---|---|---|---|---|---|
| Composite Substrate | Coefficient of Thermal Expansion $\alpha_S$ ($10^{-6}$/° C.) | 6.00 | 6.33 | 6.67 | 7.00 | 7.25 | 7.50 | — |
|  | $\alpha_S/\alpha_{GaN}$ Ratio | 1.027 | 1.084 | 1.142 | 1.199 | 1.241 | 1.284 | — |
| Wafer | Shape of Warpage [GaN Film Side] | Recess | Projection | Projection | Projection | Projection | — | Projection |
|  | Amount of Warpage [GaN Film] (μm) | 10 | 15 | 120 | 230 | 745 | — | 750 |
|  | Cracks Counted in GaN Film | Extremely few | Extremely few | Few | Few | Few | — | Few |
|  | Dislocation Density of GaN Film ($10^8$ cm$^{-2}$) | 1 | 1 | 2 | 3 | 4 | — | 4 |
|  | Notes |  |  |  |  |  | Crack in Support Substrate |  |

Referring to Table 1, by employing a composite substrate (wafers B to K) having a support substrate in which coefficient of thermal expansion $\alpha_S$ in a main surface was more than 0.8 time and less than 1.2 times (that is, $0.8<(\alpha_S/\alpha_{GaN}$ ratio$)<1.2$) as high as coefficient of thermal expansion $\alpha_{GaN}$ of GaN crystal, a GaN film less in warpage, low in dislocation density, and excellent in crystallinity could be formed. In addition, from a point of view of further decrease in warpage and dislocation density of the GaN film, coefficient of thermal expansion $\alpha_S$ in a main surface of the support substrate of the composite substrate was preferably more than 0.9 time and less than 1.15 times (that is, $0.9 < (\alpha_S/\alpha_{GaN} \text{ ratio}) < 1.15$) as high as coefficient of thermal expansion $\alpha_{GaN}$ of the GaN crystal (wafers E to J) and further preferably more than 0.95 time and less than 1.1 times (that is, $0.95 < (\alpha_S/\alpha_{GaN} \text{ ratio}) < 1.1$) as high as coefficient of thermal expansion $\alpha_{GaN}$ of the GaN crystal (wafers F to I).

Example 2

1. Measurement of Coefficient of Thermal Expansion of GaN Crystal

Measurement as in Example 1 was conducted and then average coefficient of thermal expansion $\alpha_{GaN}$ of the GaN crystal in the direction of the a axis from 25° C. to 800° C. was $5.84 \times 10^{-6}/°$ C.

2. Step of Preparing Composite Substrate
(1) Sub Step of Preparing Support Substrate Referring to FIG. 3(A), 57 types of YSZ (yttria stabilized zirconia)-mullite-based sintered bodies A0, B1 to B8, C1 to C8, D1 to D8, E1 to E8, F1 to F8, G1 to G8, and H1 to H8 as a material for support substrate 11, manufactured with atmospheric-pressure sintering of sintering at 1 atmosphere at 1700° C. for 10 hours and with HIP (hot isostatic pressing) of sintering at 2000 atmospheres at 1700° C. for 1 hour, were subjected to X-ray diffraction, to confirm presence and a ratio of $Y_2O_3$, $ZrO_2$, and mullite ($3Al_2O_3 \cdot 2SiO_2$ to $2Al_2O_3 \cdot SiO_2$, specifically $Al_6O_{13}Si_2$). In addition, a sample for measurement having a size of 2×2×20 mm (having a direction substantially parallel to the main surface of the support substrate cut from a sintered body as the longitudinal direction) was cut from each of the 57 types of the YSZ-mullite-based sintered bodies above. Here, since the YSZ-mullite-based sintered body does not have directional specificity, any cutting direction was set. Average coefficient of thermal expansion $\alpha_S$ of each of these samples for measurement when a temperature was increased from a room temperature (25° C.) to 800° C. was measured as described above.

YSZ-mullite-based sintered body A0 had a content of YSZ to the total of YSZ and mullite (hereinafter referred to as a YSZ content) of 0 mass %, average coefficient of thermal expansion $\alpha_S$ from 25° C. to 800° C. (hereinafter simply referred to as average coefficient of thermal expansion $\alpha_S$) thereof was not measured, and a ratio of average coefficient of thermal expansion $\alpha_S$ of the sintered body to average coefficient of thermal expansion $\alpha_{GaN}$ of the GaN crystal in the direction of the a axis (hereinafter denoted as the $\alpha_S/\alpha_{GaN}$ ratio) was not calculated.

YSZ-mullite-based sintered body B1 had a YSZ content of 20 mass %, a content of $Y_2O_3$ (yttria) to YSZ (hereinafter referred to as a $Y_2O_3$ content) of 0 mol %, average coefficient of thermal expansion $\alpha_S$ of $4.40 \times 10^{-6}/°$ C., and the $\alpha_S/\alpha_{GaN}$ ratio of 0.753. YSZ-mullite-based sintered body B2 had a YSZ content of 20 mass %, a $Y_2O_3$ content of 3 mol %, average coefficient of thermal expansion $\alpha_S$ of $4.58 \times 10^{-6}/°$ C., and the $\alpha_S/\alpha_{GaN}$ ratio of 0.784. YSZ-mullite-based sintered body B3 had a YSZ content of 20 mass %, a $Y_2O_3$ content of 5 mol %, average coefficient of thermal expansion $\alpha_S$ of $4.68 \times 10^{-6}/°$ C., and the $\alpha_S/\alpha_{GaN}$ ratio of 0.801. YSZ-mullite-based sintered body B4 had a YSZ content of 20 mass %, a $Y_2O_3$ content of 6 mol %, average coefficient of thermal expansion $\alpha_S$ of $4.69 \times 10^{-6}/°$ C., and the $\alpha_S/\alpha_{GaN}$ ratio of 0.803. YSZ-mullite-based sintered body B5 had a YSZ content of 20 mass %, a $Y_2O_3$ content of 10 mol %, average coefficient of thermal expansion $\alpha_S$ of $4.72 \times 10^{-6}/°$ C., and the $\alpha_S/\alpha_{GaN}$ ratio of 0.808. YSZ-mullite-based sintered body B6 had a YSZ content of 20 mass %, a $Y_2O_3$ content of 20 mol %, average coefficient of thermal expansion $\alpha_S$ of $4.81 \times 10^{-6}/°$ C., and the $\alpha_S/\alpha_{GaN}$ ratio of 0.823. YSZ-mullite-based sintered body B7 had a YSZ content of 20 mass %, a $Y_2O_3$ content of 50 mol %, average coefficient of thermal expansion $\alpha_S$ of $5.06 \times 10^{-6}/°$ C., and the $\alpha_S/\alpha_{GaN}$ ratio of 0.866. YSZ-mullite-based sintered body B8 had a YSZ content of 20 mass %, a $Y_2O_3$ content of 100 mol %, average coefficient of thermal expansion $\alpha_S$ was not measured, and the $\alpha_S/\alpha_{GaN}$ ratio was not calculated.

YSZ-mullite-based sintered body C1 had a YSZ content of 25 mass %, a $Y_2O_3$ content of 0 mol %, average coefficient of thermal expansion $\alpha_S$ of $4.48 \times 10^{-6}/°$ C., and the $\alpha_S/\alpha_{GaN}$ ratio of 0.767. YSZ-mullite-based sintered body C2 had a YSZ content of 25 mass %, a $Y_2O_3$ content of 3 mol %, average coefficient of thermal expansion $\alpha_S$ of $4.62 \times 10^{-6}/°$ C., and the $\alpha_S/\alpha_{GaN}$ ratio of 0.791. YSZ-mullite-based sintered body C3 had a YSZ content of 25 mass %, a $Y_2O_3$ content of 5 mol %, average coefficient of thermal expansion $\alpha_S$ of $5.26 \times 10^{-6}/°$ C., and the $\alpha_S/\alpha_{GaN}$ ratio of 0.901. YSZ-mullite-based sintered body C4 had a YSZ content of 25 mass %, a $Y_2O_3$ content of 6 mol %, average coefficient of thermal expansion $\alpha_S$ of $5.27 \times 10^{-6}/°$ C., and the $\alpha_S/\alpha_{GaN}$ ratio of 0.903. YSZ-mullite-based sintered body C5 had a YSZ content of 25 mass %, a $Y_2O_3$ content of 10 mol %, average coefficient of thermal expansion $\alpha_S$ of $5.31 \times 10^{-6}/°$ C., and the $\alpha_S/\alpha_{GaN}$ ratio of 0.909. YSZ-mullite-based sintered body C6 had a YSZ content of 25 mass %, a $Y_2O_3$ content of 20 mol %, average coefficient of thermal expansion $\alpha_S$ of $5.40 \times 10^{-6}/°$ C., and the $\alpha_S/\alpha_{GaN}$ ratio of 0.925. YSZ-mullite-based sintered body C7 had a YSZ content of 25 mass %, a $Y_2O_3$ content of 50 mol %, average coefficient of thermal expansion $\alpha_S$ of $5.69 \times 10^{-6}/°$ C., and the $\alpha_S/\alpha_{GaN}$ ratio of 0.974. YSZ-mullite-based sintered body C8 had a YSZ content of 25 mass %, a $Y_2O_3$ content of 100 mol %, average coefficient of thermal expansion $\alpha_S$ was not measured, and the $\alpha_S/\alpha_{GaN}$ ratio was not calculated.

YSZ-mullite-based sintered body D1 had a YSZ content of 30 mass %, a $Y_2O_3$ content of 0 mol %, average coefficient of thermal expansion $\alpha_S$ of $4.56 \times 10^{-6}/°$ C., and the $\alpha_S/\alpha_{GaN}$ ratio of 0.781. YSZ-mullite-based sintered body D2 had a YSZ content of 30 mass %, a $Y_2O_3$ content of 3 mol %, average coefficient of thermal expansion $\alpha_S$ of $4.65 \times 10^{-6}/°$ C., and the $\alpha_S/\alpha_{GaN}$ ratio of 0.796. YSZ-mullite-based sintered body D3 had a YSZ content of 30 mass %, a $Y_2O_3$ content of 5 mol %, average coefficient of thermal expansion $\alpha_S$ of $5.55 \times 10^{-6}/°$ C., and the $\alpha_S/\alpha_{GaN}$ ratio of 0.950. YSZ-mullite-based sintered body D4 had a YSZ content of 30 mass %, a $Y_2O_3$ content of 6 mol %, average coefficient of thermal expansion $\alpha_S$ of $5.56 \times 10^{-6}/°$ C., and the $\alpha_S/\alpha_{GaN}$ ratio of 0.952. YSZ-mullite-based sintered body D5 had a YSZ content of 30 mass %, a $Y_2O_3$ content of 10 mol %, average coefficient of thermal expansion $\alpha_S$ of $5.60 \times 10^{-6}/°$ C., and the $\alpha_S/\alpha_{GaN}$ ratio of 0.959. YSZ-mullite-based sintered body D6 had a YSZ content of 30 mass %, a $Y_2O_3$ content of 20 mol %, average coefficient of thermal expansion $\alpha_S$ of $5.70 \times 10^{-6}/°$ C., and the $\alpha_S/\alpha_{GaN}$ ratio of 0.976. YSZ-mullite-based sintered body D7 had a YSZ content of 30 mass %, a $Y_2O_3$ content of 50 mol %, average coefficient of thermal expansion $\alpha_S$ of $6.00 \times 10^{-6}/°$ C., and the $\alpha_S/\alpha_{GaN}$ ratio of 1.027. YSZ-mullite-based sintered body D8 had a YSZ content of 30 mass %, a $Y_2O_3$ content of 100 mol %, average coefficient of thermal expansion $\alpha_S$ was not measured, and the $\alpha_S/\alpha_{GaN}$ ratio was not calculated.

YSZ-mullite-based sintered body E1 had a YSZ content of 35 mass %, a $Y_2O_3$ content of 0 mol %, average coefficient of thermal expansion $\alpha_S$ of $4.77 \times 10^{-6}/°$ C., and the $\alpha_S/\alpha_{GaN}$ ratio of 0.816. YSZ-mullite-based sintered body E2 had a YSZ content of 35 mass %, a $Y_2O_3$ content of 3 mol %, average coefficient of thermal expansion $\alpha_S$ of $4.86 \times 10^{-6}/°$ C., and the $\alpha_S/\alpha_{GaN}$ ratio of 0.832. YSZ-mullite-based sintered body E3 had a YSZ content of 35 mass %, a $Y_2O_3$ content of 5 mol %, average coefficient of thermal expansion $\alpha_S$ of $5.80 \times 10^{-6}/°$ C., and the $\alpha_S/\alpha_{GaN}$ ratio of 0.993. YSZ-mullite-based sintered body E4 had a YSZ content of 35 mass %, a $Y_2O_3$ content of 6 mol %, average coefficient of thermal expansion $\alpha_S$ of $5.81 \times 10^{-6}/°$ C., and the $\alpha_S/\alpha_{GaN}$ ratio of 0.995. YSZ-mullite-based sintered body E5 had a YSZ content of 35 mass %, a $Y_2O_3$ content of 10 mol %, average coefficient of thermal expansion $\alpha_S$ of $5.85 \times 10^{-6}/°$ C., and the $\alpha_S/\alpha_{GaN}$ ratio of 1.002. YSZ-mullite-based sintered body E6 had a YSZ content of 35 mass %, a $Y_2O_3$ content of 20 mol %, average coefficient of thermal expansion $\alpha_S$ of $5.96 \times 10^{-6}/°$ C., and the $\alpha_S/\alpha_{GaN}$ ratio of 1.020. YSZ-mullite-based sintered body E7 had a YSZ content of 35 mass %, a $Y_2O_3$ content of 50 mol %, average coefficient of thermal expansion $\alpha_S$ of $6.27 \times 10^{-6}/°$ C., and the $\alpha_S/\alpha_{GaN}$ ratio of 1.074. YSZ-mullite-based sintered body E8 had a YSZ content of 35 mass %, a $Y_2O_3$ content of 100 mol %, average coefficient of thermal expansion $\alpha_S$ was not measured, and the $\alpha_S/\alpha_{GaN}$ ratio was not calculated.

YSZ-mullite-based sintered body F1 had a YSZ content of 40 mass %, a $Y_2O_3$ content of 0 mol %, average coefficient of thermal expansion $\alpha_S$ of $4.97 \times 10^{-6}/°$ C., and the $\alpha_S/\alpha_{GaN}$ ratio of 0.851. YSZ-mullite-based sintered body F2 had a YSZ content of 40 mass %, a $Y_2O_3$ content of 3 mol %, average coefficient of thermal expansion $\alpha_S$ of $5.07 \times 10^{-6}/°$ C., and the $\alpha_S/\alpha_{GaN}$ ratio of 0.868. YSZ-mullite-based sintered body F3 had a YSZ content of 40 mass %, a $Y_2O_3$ content of 5 mol %, average coefficient of thermal expansion $\alpha_S$ of $6.05 \times 10^{-6}/°$ C., and the $\alpha_S/\alpha_{GaN}$ ratio of 1.036. YSZ-mullite-based sintered body F4 had a YSZ content of 40 mass %, a $Y_2O_3$ content of 6 mol %, average coefficient of thermal expansion $\alpha_S$ of $6.06 \times 10^{-6}/°$ C., and the $\alpha_S/\alpha_{GaN}$ ratio of 1.038. YSZ-mullite-based sintered body F5 had a YSZ content of 40 mass %, a $Y_2O_3$ content of 10 mol %, average coefficient of thermal expansion $\alpha_S$ of $6.10 \times 10^{-6}/°$ C., and the $\alpha_S/\alpha_{GaN}$ ratio of 1.045. YSZ-mullite-based sintered body F6 had a YSZ content of 40 mass %, a $Y_2O_3$ content of 20 mol %, average coefficient of thermal expansion $\alpha_S$ of $6.21 \times 10^{-6}/°$ C., and the $\alpha_S/\alpha_{GaN}$ ratio of 1.064. YSZ-mullite-based sintered body F7 had a YSZ content of 40 mass %, a $Y_2O_3$ content of 50 mol %, average coefficient of thermal expansion $\alpha_S$ of $6.54 \times 10^{-6}/°$ C., and the $\alpha_S/\alpha_{GaN}$ ratio of 1.120. YSZ-mullite-based sintered body F8 had a YSZ content of 40 mass %, a $Y_2O_3$ content of 100 mol %, average coefficient of thermal expansion $\alpha_S$ was not measured, and the $\alpha_S/\alpha_{GaN}$ ratio was not calculated.

YSZ-mullite-based sintered body G1 had a YSZ content of 70 mass %, a $Y_2O_3$ content of 0 mol %, average coefficient of thermal expansion $\alpha_S$ of $4.99 \times 10^{-6}/°$ C., and the $\alpha_S/\alpha_{GaN}$ ratio of 0.854. YSZ-mullite-based sintered body G2 had a YSZ content of 70 mass %, a $Y_2O_3$ content of 3 mol %, average coefficient of thermal expansion $\alpha_S$ of $5.09 \times 10^{-6}/°$ C., and the $\alpha_S/\alpha_{GaN}$ ratio of 0.872. YSZ-mullite-based sintered body G3 had a YSZ content of 70 mass %, a $Y_2O_3$ content of 5 mol %, average coefficient of thermal expansion $\alpha_S$ of $6.07 \times 10^{-6}/°$ C., and the $\alpha_S/\alpha_{GaN}$ ratio of 1.039. YSZ-mullite-based sintered body G4 had a YSZ content of 70 mass %, a $Y_2O_3$ content of 6 mol %, average coefficient of thermal expansion $\alpha_S$ of $6.08 \times 10^{-6}/°$ C., and the $\alpha_S/\alpha_{GaN}$ ratio of 1.041. YSZ-mullite-based sintered body G5 had a YSZ content of 70 mass %, a $Y_2O_3$ content of 10 mol %, average coefficient of thermal expansion $\alpha_S$ of $6.12 \times 10^{-6}/°$ C., and the $\alpha_S/\alpha_{GaN}$ ratio of 1.048. YSZ-mullite-based sintered body G6 had a YSZ content of 70 mass %, a $Y_2O_3$ content of 20 mol %, average coefficient of thermal expansion $\alpha_S$ of $6.23 \times 10^{-6}/°$ C., and the $\alpha_S/\alpha_{GaN}$ ratio of 1.067. YSZ-mullite-based sintered body G7 had a YSZ content of 70 mass %, a $Y_2O_3$ content of 50 mol %, average coefficient of thermal expansion $\alpha_S$ of $6.56 \times 10^{-6}/°$ C., and the $\alpha_S/\alpha_{GaN}$ ratio of 1.123. YSZ-mullite-based sintered body G8 had a YSZ content of 70 mass %, a $Y_2O_3$ content of 100 mol %, average coefficient of thermal expansion $\alpha_S$ was not measured, and the $\alpha_S/\alpha_{GaN}$ ratio was not calculated.

YSZ-mullite-based sintered body H1 had a YSZ content of 100 mass %, a $Y_2O_3$ content of 0 mol %, average coefficient of thermal expansion $\alpha_S$ was not measured, and the $\alpha_S/\alpha_{GaN}$ ratio was not calculated. YSZ-mullite-based sintered body H2 had a YSZ content of 100 mass %, a $Y_2O_3$ content of 3 mol %, average coefficient of thermal expansion $\alpha_S$ was not measured, and the $\alpha_S/\alpha_{GaN}$ ratio was not calculated. YSZ-mullite-based sintered body H3 had a YSZ content of 100 mass %, a $Y_2O_3$ content of 5 mol %, average coefficient of thermal expansion $\alpha_S$ was not measured, and the $\alpha_S/\alpha_{GaN}$ ratio was not calculated. YSZ-mullite-based sintered body H4 had a YSZ content of 100 mass %, a $Y_2O_3$ content of 6 mol %, average coefficient of thermal expansion $\alpha_S$ was not measured, and the $\alpha_S/\alpha_{GaN}$ ratio was not calculated. YSZ-mullite-based sintered body H5 had a YSZ content of 100 mass %, a $Y_2O_3$ content of 10 mol %, average coefficient of thermal expansion $\alpha_S$ was not measured, and the $\alpha_S/\alpha_{GaN}$ ratio was not calculated. YSZ-mullite-based sintered body H6 had a YSZ content of 100 mass %, a $Y_2O_3$ content of 20 mol %, average coefficient of thermal expansion $\alpha_S$ was not measured, and the $\alpha_S/\alpha_{GaN}$ ratio was not calculated. YSZ-mullite-based sintered body H7 had a YSZ content of 100 mass %, a $Y_2O_3$ content of 50 mol %, average coefficient of thermal expansion $\alpha_S$ was not measured, and the $\alpha_S/\alpha_{GaN}$ ratio was not calculated. YSZ-mullite-based sintered body H8 had a YSZ content of 100 mass %, a $Y_2O_3$ content of 100 mol %, average coefficient of thermal expansion $\alpha_S$ was not measured, and the $\alpha_S/\alpha_{GaN}$ ratio was not calculated.

A support substrate having a diameter of 4 inches (101.6 mm) and a thickness of 1 mm was cut from each of the 57 types of the YSZ-mullite-based sintered bodies above, and opposing main surfaces of each support substrate were mirror-polished to thereby obtain 57 types of support substrates A0, B1 to B8, C1 to C8, D1 to D8, E1 to E8, F1 to F8, G1 to G8, and H1 to H8. Namely, a content of YSZ to the total of YSZ and mullite (a YSZ content), a content of $Y_2O_3$ (yttria) to YSZ (a $Y_2O_3$ content), and an average coefficient of thermal expansion from 25° C. to 800° C. of the 57 types of the support substrates above were equal to a YSZ content, a $Y_2O_3$ content, and an average coefficient of thermal expansion from 25° C. to 800° C. of the 57 types of the YSZ-mullite-based sintered bodies above, respectively. Tables 2 to 8 summarize these results. In Tables 2 to 8, "-" indicates that that physical property value was not measured or calculated.

(2) Sub Step of Forming Single Crystal Film on Underlying Substrate

Referring to FIG. 3(B), an Si substrate having a mirror-polished (111) plane as main surface 30n and having a diameter of 5 inches (127 mm) and a thickness of 0.5 mm was prepared as underlying substrate 30.

A GaN film having a thickness of 0.4 μm was formed as single crystal film 13 on main surface 30n of the Si substrate (underlying substrate 30) above with the MOCVD method.

Regarding film formation conditions, a TMG gas and an NH$_3$ gas were used as source gases, an H$_2$ gas was used as a carrier gas, a film formation temperature was set to 1000° C., and a film formation pressure was set to 1 atmosphere. Main surface 13m of the GaN film (single crystal film 13) thus obtained had a plane orientation having an off angle within ±1° with respect to the (0001) plane.

(3) Sub Step of Bonding Support Substrate and Single Crystal Film to Each Other

Referring to (C1) in FIG. 3(C), an SiO$_2$ film having a thickness of 300 nm was formed on main surface 11m of each of the 57 types of support substrates A0, B1 to B8, C1 to C8, D1 to D8, E1 to E8, F1 to F8, G1 to G8, and H1 to H8 (support substrate 11) in FIG. 3(A) with the CVD (chemical vapor deposition) method. Then, by polishing the SiO$_2$ film having a thickness of 300 nm on main surface 11m of each of the 57 types of support substrates (support substrate 11) above with CeO$_2$ slurry, only an SiO$_2$ layer having a thickness of 270 nm was allowed to remain to serve as adhesive layer 12a. Thus, pores in main surface 11m of each of the 57 types of the support substrates (support substrate 11) above were buried to thereby obtain the SiO$_2$ layer (adhesive layer 12a) having flat main surface 12am and a thickness of 270 nm.

Referring also to (C2) in FIG. 3(C), an SiO$_2$ film having a thickness of 300 nm was formed on main surface 13n of the GaN film (single crystal film 13) formed on the Si substrate (underlying substrate 30) in FIG. 3(B) with the CVD method. Then, by polishing this SiO$_2$ film having a thickness of 300 nm with CeO$_2$ slurry, only an SiO$_2$ layer having a thickness of 270 nm was allowed to remain to serve as adhesive layer 12b.

Referring next to (C3) in FIG. 3(C), main surface 12am of the SiO$_2$ layer (adhesive layer 12a) formed on each of the 57 types of the support substrates (support substrate 11) above and main surface 12bn of the SiO$_2$ layer (adhesive layer 12b) formed on the GaN film (single crystal film 13) formed on the Si substrate (underlying substrate 30) were cleaned and activated by argon plasma, and thereafter main surface 12am of the SiO$_2$ layer (adhesive layer 12a) and main surface 12bn of the SiO$_2$ layer (adhesive layer 12b) were bonded to each other, followed by heat treatment for 2 hours in a nitrogen atmosphere at 300° C.

(4) Sub Step of Removing Underlying Substrate

Referring to FIG. 3(D), a main surface on a back side (a side where single crystal film 13 was not bonded) and a side surface of each of the 57 types of the support substrates (support substrate 11) above were covered and protected with wax 40, and thereafter the Si substrate (underlying substrate 30) was removed by etching using a mixed acid aqueous solution of 10 mass % of hydrofluoric acid and 5 mass % of nitric acid. Thus, 57 types of composite substrates A0, B1 to B8, C1 to C8, D1 to D8, E1 to E8, F1 to F8, G1 to G8, and H1 to H8 (composite substrate 10) in which GaN films (single crystal films 13) were arranged on the main surface 11m sides of the 57 types of the support substrates (support substrates 11) above respectively were obtained.

3. Step of Forming GaN-Based Film

Referring to FIG. 2(B), a GaN film (GaN-based film 20) was formed with the MOCVD method on main surface 13m (such a main surface being a (0001) plane) of the GaN film (single crystal film 13) of each of the 57 types of the composite substrates (composite substrate 10) having a diameter of 4 inches (101.6 mm) obtained above and on a main surface of a sapphire substrate having a diameter of 4 inches (101.6 mm) and a thickness of 1 mm (such a main surface being a (0001) plane). In forming the GaN film (GaN-based film 20), a TMG (trimethylgallium) gas and an NH$_3$ gas were used as source gases, an H$_2$ gas was used as a carrier gas, and a GaN buffer layer (GaN-based buffer layer 21) was grown to a thickness of 50 nm at 500° C. and then a GaN single crystal layer (GaN-based single crystal layer 23) was grown to a thickness of 50 nm at 1050° C. Here, a rate of growth of the GaN single crystal layer was 1 μm/hr. Thereafter, 57 types of wafers A0, B1 to B8, C1 to C8, D1 to D8, E1 to E8, F1 to F8, G1 to G8, and H1 to H8 in which GaN films were formed on the 57 types of the composite substrates above respectively were cooled to a room temperature (25° C.) at a rate of 10° C./min.

Regarding the 57 types of the wafers taken out of a film formation apparatus after cooling to a room temperature, warpage of the wafer and crack count and dislocation density of the GaN film were determined. Here, a shape of warpage and an amount of warpage of the wafer were determined based on interference fringes observed at the main surface of the GaN film with FM200E Wafer of Corning Tropel. Regarding crack count in the GaN film, the number of cracks per unit length was counted with a Nomarski microscope, and evaluation as "extremely few", "few", "many", and "extremely many" was made when the count was smaller than 1 count/mm, when the count was not smaller than 1 count/mm and smaller than 5 counts/mm, when the count was not smaller than 5 counts/mm and smaller than 10 counts/mm, and when the count was not smaller than 10 counts/mm, respectively. Dislocation density of the GaN film was measured with CL (cathode luminescence) based on the number of dark points per unit area. It is noted that cracks generated in the GaN film in the present Example were small without penetrating the film.

Wafer A0 was extremely many in cracks counted in the GaN film, and a shape of warpage, an amount of warpage, and dislocation density of the GaN film were not measured. Table 2 summarizes results.

Wafer B1 warped on the GaN film side in a recessed manner, an amount of warpage was 670 μm, cracks counted in the GaN film were many, and dislocation density of the GaN film was $5\times10^8$ cm$^{-2}$. Wafer B2 warped on the GaN film side in a recessed manner, an amount of warpage was 660 cracks counted in the GaN film were many, and dislocation density of the GaN film was $5\times10^8$ cm$^{-2}$. Wafer B3 warped on the GaN film side in a recessed manner, an amount of warpage was 655 μm, cracks counted in the GaN film were few, and dislocation density of the GaN film was $2\times10^8$ cm$^{-2}$. Wafer B4 warped on the GaN film side in a recessed manner, an amount of warpage was 650 μm, cracks counted in the GaN film were few, and dislocation density of the GaN film was $2\times10^8$ cm$^{-2}$. Wafer B5 warped on the GaN film side in a recessed manner, an amount of warpage was 645 μm, cracks counted in the GaN film were few, and dislocation density of the GaN film was $2\times10^8$ cm$^{-2}$. Wafer B6 warped on the GaN film side in a recessed manner, an amount of warpage was 610 μm, cracks counted in the GaN film were few, and dislocation density of the GaN film was $2\times10^8$ cm$^{-2}$. Wafer B7 warped on the GaN film side in a recessed manner, an amount of warpage was 480 μm, cracks counted in the GaN film were few, and dislocation density of the GaN film was $2\times10^8$ cm$^{-2}$. Wafer B8 was few in cracks counted in the GaN film, and a shape of warpage, an amount of warpage, and dislocation density of the GaN film were not measured. Table 2 summarizes results.

Wafer C1 warped on the GaN film side in a recessed manner, an amount of warpage was 665 μm, cracks counted in the GaN film were many, and dislocation density of the GaN film was $5\times10^8$ cm$^{-2}$. Wafer C2 warped on the GaN film side in a recessed manner, an amount of warpage was 657 μm, cracks counted in the GaN film were many, and dislocation density of the GaN film was $5\times10^8$ cm$^{-2}$. Wafer C3 warped on the GaN film side in a recessed manner, an amount of warpage was 390 μm, cracks counted in the GaN film were few, and dislocation density of the GaN film was $2\times10^8$ cm$^{-2}$. Wafer C4 warped on the GaN film side in a recessed manner, an amount of warpage was 385 μm, cracks counted in the GaN film were few, and dislocation density of the GaN film was $2\times10^8$ cm$^{-2}$. Wafer C5 warped on the GaN film side in a recessed manner, an amount of warpage was 380 μm, cracks counted in the GaN film were few, and dislocation density of the GaN film was $2\times10^8$ cm$^{-2}$. Wafer C6 warped on the GaN film side in a recessed manner, an amount of warpage was 350 μm, cracks counted in the GaN film were few, and dislocation density of the GaN film was $2\times10^8$ cm$^{-2}$. Wafer C7 warped on the GaN film side in a recessed manner, an amount of warpage was 180 μm, cracks counted in the GaN film were extremely few, and dislocation density of the GaN film was $1\times10^8$ cm$^{-2}$. Wafer C8 was few in cracks counted in the GaN film, and a shape of warpage, an amount of warpage, and dislocation density of the GaN film were not measured. Table 3 summarizes results.

Wafer D1 warped on the GaN film side in a recessed manner, an amount of warpage was 660 μm, cracks counted in the GaN film were many, and dislocation density of the GaN film was $5\times10^8$ cm$^{-2}$. Wafer D2 warped on the GaN film side in a recessed manner, an amount of warpage was 650 μm, cracks counted in the GaN film were many, and dislocation density of the GaN film was $5\times10^8$ cm$^{-2}$. Wafer D3 warped on the GaN film side in a recessed manner, an amount of warpage was 250 μm, cracks counted in the GaN film were few, and dislocation density of the GaN film was $2\times10^8$ cm$^{-2}$. Wafer D4 warped on the GaN film side in a recessed manner, an amount of warpage was 240 μm, cracks counted in the GaN film were few, and dislocation density of the GaN film was $2\times10^8$ cm$^{-2}$. Wafer D5 warped on the GaN film side in a recessed manner, an amount of warpage was 230 μm, cracks counted in the GaN film were extremely few, and dislocation density of the GaN film was $1\times10^8$ cm$^{-2}$. Wafer D6 warped on the GaN film side in a recessed manner, an amount of warpage was 180 μm, cracks counted in the GaN film were extremely few, and dislocation density of the GaN film was $1\times10^8$ cm$^{-2}$. Wafer D7 warped on the GaN film side in a recessed manner, an amount of warpage was 10 μm, cracks counted in the GaN film were few, and dislocation density of the GaN film was $2\times10^8$ cm$^{-2}$. Wafer D8 was few in cracks counted in the GaN film, and a shape of warpage, an amount of warpage, and dislocation density of the GaN film were not measured. Table 4 summarizes results.

Wafer E1 warped on the GaN film side in a recessed manner, an amount of warpage was 630 μm, cracks counted in the GaN film were many, and dislocation density of the GaN film was $5\times10^8$ cm$^{-2}$. Wafer E2 warped on the GaN film side in a recessed manner, an amount of warpage was 520 μm, cracks counted in the GaN film were many, and dislocation density of the GaN film was $5\times10^8$ cm$^{-2}$. Wafer E3 warped on the GaN film side in a recessed manner, an amount of warpage was 150 μm, cracks counted in the GaN film were few, and dislocation density of the GaN film was $2\times10^8$ cm$^{-2}$. Wafer E4 warped on the GaN film side in a recessed manner, an amount of warpage was 120 μm, cracks counted in the GaN film were extremely few, and dislocation density of the GaN film was $1\times10^8$ cm$^{-2}$. Wafer E5 warped on the GaN film side in a recessed manner, an amount of warpage was 1 μm, cracks counted in the GaN film were extremely few, and dislocation density of the GaN film was $1\times10^8$ cm$^{-2}$. Wafer E6 warped on the GaN film side in a projecting manner, an amount of warpage was 7 μm, cracks counted in the GaN film were few, and dislocation density of the GaN film was $2\times10^8$ cm$^{-2}$. Wafer E7 warped on the GaN film side in a projecting manner, an amount of warpage was 12 μm, cracks counted in the GaN film were few, and dislocation density of the GaN film was $2\times10^8$ cm$^{-2}$. Wafer E8 was few in cracks counted in the GaN film, and a shape of warpage, an amount of warpage, and dislocation density of the GaN film were not measured. Table 5 summarizes results.

Wafer F1 warped on the GaN film side in a recessed manner, an amount of warpage was 500 μm, cracks counted in the GaN film were many, and dislocation density of the GaN film was $5\times10^8$ cm$^{-2}$. Wafer F2 warped on the GaN film side in a recessed manner, an amount of warpage was 480 μm, cracks counted in the GaN film were many, and dislocation density of the GaN film was $5\times10^8$ cm$^{-2}$. Wafer F3 warped on the GaN film side in a projecting manner, an amount of warpage was 10 μm, cracks counted in the GaN film were few, and dislocation density of the GaN film was $2\times10^8$ cm$^{-2}$. Wafer F4 warped on the GaN film side in a projecting manner, an amount of warpage was 10 μm, cracks counted in the GaN film were few, and dislocation density of the GaN film was $2\times10^8$ cm$^{-2}$. Wafer F5 warped on the GaN film side in a projecting manner, an amount of warpage was 11 μm, cracks counted in the GaN film were few, and dislocation density of the GaN film was $2\times10^8$ cm$^{-2}$. Wafer F6 warped on the GaN film side in a projecting manner, an amount of warpage was 12 μm, cracks counted in the GaN film were few, and dislocation density of the GaN film was $2\times10^8$ cm$^{-2}$. Wafer F7 warped on the GaN film side in a projecting manner, an amount of warpage was 110 cracks counted in the GaN film were few, and dislocation density of the GaN film was $2\times10^8$ cm$^{-2}$. Wafer F8 was few in cracks counted in the GaN film, and a shape of warpage, an amount of warpage, and dislocation density of the GaN film were not measured. Table 6 summarizes results.

Wafer G1 warped on the GaN film side in a recessed manner, an amount of warpage was 510 μm, cracks counted in the GaN film were extremely many, and dislocation density of the GaN film was $5\times10^8$ cm$^{-2}$. Wafer G2 warped on the GaN film side in a recessed manner, an amount of warpage was 490 μm, cracks counted in the GaN film were extremely many, and dislocation density of the GaN film was $5\times10^8$ cm$^{-2}$. Wafer G3 warped on the GaN film side in a projecting manner, an amount of warpage was 10 μm, cracks counted in the GaN film were extremely many, and dislocation density of the GaN film was $2\times10^8$ cm$^{-2}$. Wafer G4 warped on the GaN film side in a projecting manner, an amount of warpage was 11 μm, cracks counted in the GaN film were extremely many, and dislocation density of the GaN film was $2\times10^8$ cm$^{-2}$. Wafer G5 warped on the GaN film side in a projecting manner, an amount of warpage was 11 μm, cracks counted in the GaN film were extremely many, and dislocation density of the GaN film was $2\times10^8$ cm$^{-2}$. Wafer G6 warped on the GaN film side in a projecting manner, an amount of warpage was 12 μm, cracks counted in the GaN film were extremely many, and dislocation density of the GaN film was $2\times10^8$ cm$^{-2}$. Wafer G7 warped on the GaN film side in a projecting manner, an amount of warpage was 110 μm, cracks counted in the GaN film were extremely many, and dislocation density of the GaN film was $2\times10^8$ cm$^{-2}$. Wafer G8 was extremely many in cracks counted in the GaN film, and a shape of warpage, an amount of warpage, and dislocation density of the GaN film were not measured. Table 7 summarizes results.

All of wafers H1 to H8 were extremely many in cracks counted in the GaN film, and a shape of warpage, an amount of warpage, and dislocation density of the GaN film were not measured. Table 8 summarizes results.

4. Step of Removing Support Substrate

Referring to FIG. 2(C), the 57 types of the wafers obtained above were immersed in an aqueous solution of 10 mass % of hydrofluoric acid and the 57 types of the support substrates (support substrate 11) above and the SiO$_2$ layers were dissolved and removed. Thus, 57 types of GaN films A0, B1 to B8, C1 to C8, D1 to D8, E1 to E8, F1 to F8, G1 to G8, and H1 to H8 (GaN-based film 20) formed on respective main surfaces 13m of the GaN films (single crystal film 13) were obtained. In the 57 types of the GaN films (GaN-based film 20) above obtained by removing the 57 types of the support substrates (support substrate 11) above and the SiO$_2$ layers from the 57 types of the wafers above as well, warpage was found in measurement based on interference fringes observed with FM200EWafer of Corning Tropel, and an extent of warpage in each of the 57 types of the GaN films above maintained an extent of warpage in each corresponding one of the 57 types of the wafers above.

TABLE 2

| | | Wafer A0 | Wafer B1 | Wafer B2 | Wafer B3 | Wafer B4 | Wafer B5 | Wafer B6 | Wafer B7 | Wafer B8 |
|---|---|---|---|---|---|---|---|---|---|---|
| Composite Substrate | YSZ Content (Mass %) | 0 | 20 | 20 | 20 | 20 | 20 | 20 | 20 | 20 |
| | Y$_2$O$_3$ Content (Mol %) | 0 | 0 | 3 | 5 | 6 | 10 | 20 | 50 | 100 |
| | Coefficient of Thermal Expansion $\alpha_S$ ($10^{-6}$/° C.) | — | 4.40 | 4.58 | 4.68 | 4.69 | 4.72 | 4.81 | 5.06 | — |
| | $\alpha_S/\alpha_{GaN}$ Ratio | — | 0.753 | 0.784 | 0.801 | 0.803 | 0.808 | 0.823 | 0.866 | — |
| Wafer | Shape of Warpage [GaN Film Side] | — | Recess | Recess | Recess | Recess | Recess | Recess | Recess | — |
| | Amount of Warpage [GaN Film] (μm) | — | 670 | 660 | 655 | 650 | 645 | 610 | 480 | — |
| | Cracks Counted in GaN Film | Extremely many | Many | Many | Few | Few | Few | Few | Few | Few |
| | Dislocation Density of GaN Film ($10^8$ cm$^{-2}$) | — | 5 | 5 | 2 | 2 | 2 | 2 | 2 | — |
| | Notes | | | | | | | | | |

TABLE 3

| | | Wafer C1 | Wafer C2 | Wafer C3 | Wafer C4 | Wafer C5 | Wafer C6 | Wafer C7 | Wafer C8 |
|---|---|---|---|---|---|---|---|---|---|
| Composite Substrate | YSZ Content (Mass %) | 25 | 25 | 25 | 25 | 25 | 25 | 25 | 25 |
| | Y$_2$O$_3$ Content (Mol %) | 0 | 3 | 5 | 6 | 10 | 20 | 50 | 100 |
| | Coefficient of Thermal Expansion $\alpha_S$ ($10^{-6}$/° C.) | 4.48 | 4.62 | 5.26 | 5.27 | 5.31 | 5.40 | 5.69 | — |
| | $\alpha_S/\alpha_{GaN}$ Ratio | 0.767 | 0.791 | 0.901 | 0.903 | 0.909 | 0.925 | 0.974 | — |
| Wafer | Shape of Warpage [GaN Film Side] | Recess | Recess | Recess | Recess | Recess | Recess | Recess | — |
| | Amount of Warpage [GaN Film] (μm) | 665 | 657 | 390 | 385 | 380 | 350 | 180 | — |
| | Cracks Counted in GaN Film | Many | Many | Few | Few | Few | Few | Extremely few | Few |
| | Dislocation Density of GaN Film ($10^8$ cm$^{-2}$) | 5 | 5 | 2 | 2 | 2 | 2 | 1 | — |
| | Notes | | | | | | | | |

TABLE 4

| | | Wafer D1 | Wafer D2 | Wafer D3 | Wafer D4 | Wafer D5 | Wafer D6 | Wafer D7 | Wafer D8 |
|---|---|---|---|---|---|---|---|---|---|
| Composite Substrate | YSZ Content (Mass %) | 30 | 30 | 30 | 30 | 30 | 30 | 30 | 30 |
| | Y$_2$O$_3$ Content (Mol %) | 0 | 3 | 5 | 6 | 10 | 20 | 50 | 100 |
| | Coefficient of Thermal Expansion $\alpha_S$ ($10^{-6}$/° C.) | 4.56 | 4.65 | 5.55 | 5.56 | 5.60 | 5.70 | 6.00 | — |
| | $\alpha_S/\alpha_{GaN}$ Ratio | 0.781 | 0.796 | 0.950 | 0.952 | 0.959 | 0.976 | 1.027 | — |
| Wafer | Shape of Warpage [GaN Film Side] | Recess | Recess | Recess | Recess | Recess | Recess | Recess | — |
| | Amount of Warpage [GaN Film] (μm) | 660 | 650 | 250 | 240 | 230 | 180 | 10 | — |
| | Cracks Counted in GaN Film | Many | Many | Few | Few | Extremely few | Extremely few | Few | Few |
| | Dislocation Density of GaN Film ($10^8$ cm$^{-2}$) | 5 | 5 | 2 | 2 | 1 | 1 | 2 | — |
| | Notes | | | | | | | | |

TABLE 5

| | | Wafer E1 | Wafer E2 | Wafer E3 | Wafer E4 | Wafer E5 | Wafer E6 | Wafer E7 | Wafer E8 |
|---|---|---|---|---|---|---|---|---|---|
| Composite Substrate | YSZ Content (Mass %) | 35 | 35 | 35 | 35 | 35 | 35 | 35 | 35 |

TABLE 5-continued

|  |  | Wafer E1 | Wafer E2 | Wafer E3 | Wafer E4 | Wafer E5 | Wafer E6 | Wafer E7 | Wafer E8 |
|---|---|---|---|---|---|---|---|---|---|
| Wafer | $Y_2O_3$ Content (Mol %) | 0 | 3 | 5 | 6 | 10 | 20 | 50 | 100 |
|  | Coefficient of Thermal Expansion $\alpha_S$ ($10^{-6}/°$ C.) | 4.77 | 4.86 | 5.80 | 5.81 | 5.85 | 5.96 | 6.27 | — |
|  | $\alpha_S/\alpha_{GaN}$ Ratio | 0.816 | 0.832 | 0.993 | 0.995 | 1.002 | 1.020 | 1.074 | — |
|  | Shape of Warpage [GaN Film Side] | Recess | Recess | Recess | Recess | Recess | Projection | Projection | — |
|  | Amount of Warpage [GaN Film] (μm) | 630 | 520 | 150 | 120 | 1 | 7 | 12 | — |
|  | Cracks Counted in GaN Film | Many | Many | Few | Extremely few | Extremely few | Few | Few | Few |
|  | Dislocation Density of GaN Film ($10^8$ cm$^{-2}$) | 5 | 5 | 2 | 1 | 1 | 2 | 2 | — |
|  | Notes |  |  |  |  |  |  |  |  |

TABLE 6

|  |  | Wafer F1 | Wafer F2 | Wafer F3 | Wafer F4 | Wafer F5 | Wafer F6 | Wafer F7 | Wafer F8 |
|---|---|---|---|---|---|---|---|---|---|
| Composite Substrate | YSZ Content (Mass %) | 40 | 40 | 40 | 40 | 40 | 40 | 40 | 40 |
|  | $Y_2O_3$ Content (Mol %) | 0 | 3 | 5 | 6 | 10 | 20 | 50 | 100 |
| Wafer | Coefficient of Thermal Expansion $\alpha_S$ ($10^{-6}/°$ C.) | 4.97 | 5.07 | 6.05 | 6.06 | 6.10 | 6.21 | 6.54 | — |
|  | $\alpha_S/\alpha_{GaN}$ Ratio | 0.851 | 0.868 | 1.036 | 1.038 | 1.045 | 1.064 | 1.120 | — |
|  | Shape of Warpage [GaN Film Side] | Recess | Recess | Projection | Projection | Projection | Projection | Projection | — |
|  | Amount of Warpage [GaN Film] (μm) | 500 | 480 | 10 | 10 | 11 | 12 | 110 | — |
|  | Cracks Counted in GaN Film | Many | Many | Few | Few | Few | Few | Few | Few |
|  | Dislocation Density of GaN Film ($10^8$ cm$^{-2}$) | 5 | 5 | 2 | 2 | 2 | 2 | 2 | — |
|  | Notes |  |  |  |  |  |  |  |  |

TABLE 7

|  |  | Wafer G1 | Wafer G2 | Wafer G3 | Wafer G4 | Wafer G5 | Wafer G6 | Wafer G7 | Wafer G8 |
|---|---|---|---|---|---|---|---|---|---|
| Composite Substrate | YSZ Content (Mass %) | 70 | 70 | 70 | 70 | 70 | 70 | 70 | 70 |
|  | $Y_2O_3$ Content (Mol %) | 0 | 3 | 5 | 6 | 10 | 20 | 50 | 100 |
|  | Coefficient of Thermal Expansion $\alpha_S$ ($10^{-6}/°$ C.) | 4.99 | 5.09 | 6.07 | 6.08 | 6.12 | 6.23 | 6.56 | — |
| Wafer | $\alpha_S/\alpha_{GaN}$ Ratio | 0.854 | 0.872 | 1.039 | 1.041 | 1.048 | 1.067 | 1.123 | — |
|  | Shape of Warpage [GaN Film Side] | Recess | Recess | Projection | Projection | Projection | Projection | Projection | — |
|  | Amount of Warpage [GaN Film] (μm) | 510 | 490 | 10 | 11 | 11 | 12 | 110 | — |
|  | Cracks Counted in GaN Film | Extremely many | Extremely many | Extremely many | Extremely many | Extremely many | Extremely many | Extremely many | Extremely many |
|  | Dislocation Density of GaN Film ($10^8$ cm$^{-2}$) | 5 | 5 | 2 | 2 | 2 | 2 | 2 | — |
|  | Notes |  |  |  |  |  |  |  |  |

TABLE 8

|  |  | Wafer H1 | Wafer H2 | Wafer H3 | Wafer H4 | Wafer H5 | Wafer H6 | Wafer H7 | Wafer H8 |
|---|---|---|---|---|---|---|---|---|---|
| Composite Substrate | YSZ Content (Mass %) | 100 | 100 | 100 | 100 | 100 | 100 | 100 | 100 |
|  | $Y_2O_3$ Content (Mol %) | 0 | 3 | 5 | 6 | 10 | 20 | 50 | 100 |
|  | Coefficient of Thermal Expansion $\alpha_S$ ($10^{-6}/°$ C.) | — | — | — | — | — | — | — | — |
| Wafer | $\alpha_S/\alpha_{GaN}$ Ratio | — | — | — | — | — | — | — | — |
|  | Shape of Warpage [GaN Film Side] | — | — | — | — | — | — | — | — |
|  | Amount of Warpage [GaN Film] (μm) | — | — | — | — | — | — | — | — |

TABLE 8-continued

|  | Wafer H1 | Wafer H2 | Wafer H3 | Wafer H4 | Wafer H5 | Wafer H6 | Wafer H7 | Wafer H8 |
|---|---|---|---|---|---|---|---|---|
| Cracks Counted in GaN Film | Extremely many | Extremely many | Extremely many | Extremely many | Extremely many | Extremely many | Extremely many | Extremely many |
| Dislocation Density of GaN Film ($10^8$ cm$^{-2}$) | — | — | — | — | — | — | — | — |
| Notes |  |  |  |  |  |  |  |  |

Referring to Tables 2 to 8, by employing a composite substrate (wafers B3 to B7, C3 to C7, D3 to D7, E1 to E7, F1 to F7, and G1 to G7) having a support substrate in which coefficient of thermal expansion $\alpha_S$ in a main surface was more than 0.8 time and less than 1.2 times (that is, $0.8 < (\alpha_S/\alpha_{GaN}$ ratio$) < 1.2$) as high as coefficient of thermal expansion $\alpha_{GaN}$ of GaN crystal, a GaN film less in warpage, low in dislocation density, and excellent in crystallinity could be formed. In addition, from a point of view of further decrease in warpage and dislocation density of the GaN film, coefficient of thermal expansion $\alpha_S$ in a main surface of the support substrate of the composite substrate was preferably more than 0.9 time and less than 1.15 times (that is, $0.9 < (\alpha_S/\alpha_{GaN}$ ratio$) < 1.15$) as high as coefficient of thermal expansion $\alpha_{GaN}$ of the GaN crystal (wafers C3 to C7, D3 to D7, E3 to E7, F3 to F7, and G3 to G7) and further preferably more than 0.95 time and less than 1.1 times (that is, $0.95 < (\alpha_S/\alpha_{GaN}$ ratio$) < 1.1$) as high as coefficient of thermal expansion $\alpha_{GaN}$ of the GaN crystal (wafers C7, D3 to D7, E3 to E7, F3 to F6, and G3 to G6).

In addition, Table 9 summarizes relation between cracks counted in a GaN film (GaN-based film 20) grown on a GaN single crystal layer (GaN-based single crystal layer 23) of each of the 57 types of the composite substrates and a YSZ content and a $Y_2O_3$ content of each of the 57 types of support substrate 11 of the 57 types of composite substrate 10 in Table 2 to Table 8.

the GaN film (GaN-based film) formed on the GaN film (single crystal film) of the composite substrate extremely significantly decreased.

Though a case where a non-doped GaN film was formed on the composite substrate was shown in the example above, substantially the same results as in the example above were obtained also in a case where a GaN film provided with n- or p-type conductivity by doping was formed and in a case where a GaN film of which resistivity was raised by doping was formed.

Further, in a case of forming a GaN-based film such as a $Ga_xIn_yAl_{1-x-y}N$ film ($0<x<1$, $y≥0$, $x+y≤1$) instead of a GaN film as well, results as in the example above were obtained. In particular, in a case of forming a $Ga_xIn_yAl_{1-x-y}N$ film ($0.5<x<1$, $y≥0$, $x+y≤1$) instead of a GaN film, substantially the same results as in the example above were obtained.

Furthermore, a plurality of GaN-based films (specifically, $Ga_xIn_yAl_{1-x-y}N$ films ($x>0$, $y≥0$, $x+y≤1$) and the like)) can also be formed by varying a composition ratio of such a group III element as Ga, In and Al. Namely, a plurality of GaN-based films such as $Ga_xIn_yAl_{1-x-y}N$ films ($x>0$, $y≥0$, $x+y≤1$) and the like instead of a GaN film can be formed by varying a composition ratio of such a group III element as Ga, In and Al.

In carrying out the present invention, a known dislocation lowering technique such as an ELO (Epitaxial Lateral Overgrowth) technique is applicable in forming a GaN-based film.

TABLE 9

| Cracks Counted |  | $Y_2O_3$ Content (Mol %) | | | | | | | |
|---|---|---|---|---|---|---|---|---|---|
| in GaN Film |  | 0 | 3 | 5 | 6 | 10 | 20 | 50 | 100 |
| YSZ | 0 |  |  |  |  | Extremely many |  |  |  |
| Content | 20 | Many | Many | Few | Few | Few | Few | Few | Few |
| (Mass %) | 25 | Many | Many | Few | Few | Few | Few | Extremely few | Few |
|  | 30 | Many | Many | Few | Few | Extremely few | Extremely few | Few | Few |
|  | 35 | Many | Many | Few | Extremely few | Extremely few | Few | Few | Few |
|  | 40 | Many | Many | Few | Few | Few | Few | Few | Few |
|  | 70 | Extremely many | Extremely many | Extremely many | Extremely many | Extremely many | Extremely many | Extremely many | Extremely many |
|  | 100 | Extremely many | Extremely many | Extremely many | Extremely many | Extremely many | Extremely many | Extremely many | Extremely many |

Referring to Table 9, when a content of YSZ to the total of mullite (an $Al_2O_3$—$SiO_2$ composite oxide) and YSZ (yttria stabilized zirconia) contained in the support substrate of the composite substrate was not lower than 20 mass % and not higher than 40 mass % and more preferably not lower than 25 mass % and not higher than 35 mass %, cracks counted in the GaN film (GaN-based film) formed on the GaN film (single crystal film) of the composite substrate significantly decreased. In addition, when a content of $Y_2O_3$ (yttria) to YSZ was not lower than 5 mol % and more preferably not lower than 6 mol % and not higher than 50 mol %, cracks counted in In addition, after the GaN-based film is formed on the composite substrate, only the support substrate of the composite substrate or the entire composite substrate (the support substrate and the single crystal film) may be etched away. Here, the GaN-based film may be transferred to another support substrate.

It should be understood that the embodiments and the examples disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 10 composite substrate; 11 support substrate; 11*m*, 12*m*, 12*am*, 12*bn*, 13*m*, 13*n*, 20*m*, 21*m*, 23*m*, 30*n* main surface; 12, 12*a*, 12*b* adhesive layer; 13 single crystal film; 20 GaN-based film; 21 GaN-based buffer layer; 23 GaN-based single crystal layer; 30 underlying substrate; and 40 wax.

The invention claimed is:

1. A composite substrate, comprising:
a support substrate dissoluble in hydrofluoric acid; and
a single crystal film arranged on a side of a main surface of said support substrate,
a coefficient of thermal expansion in the main surface of said support substrate being more than 0.8 time and less than 1.2 times as high as a coefficient of thermal expansion of GaN crystal.

2. The composite substrate according to claim 1, wherein said support substrate contains at least any of zirconia and silica and a $ZrO_2$—$SiO_2$ composite oxide formed of zirconia and silica.

3. The composite substrate according to claim 1, wherein said support substrate contains yttria stabilized zirconia and an $Al_2O_3$—$SiO_2$ composite oxide formed of alumina and silica.

4. The composite substrate according to claim 3, wherein a content of said yttria stabilized zirconia to total of said $Al_2O_3$—$SiO_2$ composite oxide and said yttria stabilized zirconia is not lower than 20 mass % and not higher than 40 mass %.

5. The composite substrate according to claim 4, wherein a content of yttria to said yttria stabilized zirconia is not lower than 5 mol %.

6. The composite substrate according to claim 1, wherein an area of a main surface of said single crystal film of said composite substrate is not smaller than 15 $cm^2$.

* * * * *